United States Patent
Omura

(10) Patent No.: US 8,665,418 B2
(45) Date of Patent: Mar. 4, 2014

(54) PROJECTION OPTICAL SYSTEM, EXPOSURE APPARATUS, AND DEVICE MANUFACTURING METHOD

(75) Inventor: Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 825 days.

(21) Appl. No.: 12/050,903

(22) Filed: Mar. 18, 2008

(65) Prior Publication Data
US 2008/0259440 A1 Oct. 23, 2008

Related U.S. Application Data

(60) Provisional application No. 60/907,828, filed on Apr. 18, 2007.

(51) Int. Cl.
*G03B 27/54* (2006.01)
*G03B 27/52* (2006.01)
*G03B 27/42* (2006.01)

(52) U.S. Cl.
USPC .................................. 355/67; 355/63; 355/53

(58) Field of Classification Search
USPC .............................................. 355/67, 53, 63
See application file for complete search history.

(56) References Cited

U.S. PATENT DOCUMENTS

| | | | |
|---|---|---|---|
| 6,611,316 B2 | 8/2003 | Sewell | |
| 7,301,707 B2 | 11/2007 | Shafer et al. | |
| 2002/0123012 A1* | 9/2002 | Sewell | 430/397 |
| 2006/0056064 A1* | 3/2006 | Shafer et al. | 359/727 |
| 2006/0126048 A1 | 6/2006 | Sumiyoshi | |
| 2007/0153247 A1 | 7/2007 | Nagasaka | |
| 2007/0216884 A1 | 9/2007 | Nagasaka | |
| 2007/0242244 A1 | 10/2007 | Nagasaka | |
| 2007/0242254 A1 | 10/2007 | Nagasaka | |
| 2007/0242255 A1 | 10/2007 | Nagasaka | |
| 2007/0273854 A1 | 11/2007 | Nagasaka | |
| 2007/0273858 A1 | 11/2007 | Nagasaka | |
| 2007/0279606 A1 | 12/2007 | Nagasaka | |
| 2008/0013062 A1 | 1/2008 | Nagasaka | |
| 2008/0246932 A1 | 10/2008 | Shigematsu | |
| 2009/0073407 A1 | 3/2009 | Okita | |
| 2009/0153819 A1 | 6/2009 | Okita | |

FOREIGN PATENT DOCUMENTS

| | | |
|---|---|---|
| EP | 1 324 136 A1 | 7/2003 |
| EP | 1 324 138 A2 | 7/2003 |
| EP | 1662325 | 5/2006 |
| EP | 1 986 223 A1 | 10/2008 |
| EP | 2 023 379 A1 | 2/2009 |
| JP | 08-313842 | 11/1996 |

(Continued)

OTHER PUBLICATIONS

International Search Report and Written Opinion, dated Sep. 11, 2008, issued by European Patent Office for corresponding International Application No. PCT/JP2008/057785.

(Continued)

*Primary Examiner* — Peter B Kim
(74) *Attorney, Agent, or Firm* — Klarquist Sparkman, LLP

(57) ABSTRACT

A projection optical system for forming an image of a first surface on a second surface has a first imaging optical system and a second imaging optical system, and a folding member for guiding light from the first imaging optical system to the second imaging optical system. Every optical element having a power in the second imaging optical system is a refractive element.

20 Claims, 19 Drawing Sheets

(56) References Cited

FOREIGN PATENT DOCUMENTS

| | | |
|---|---|---|
| JP | 10-303114 | 11/1998 |
| JP | 2000-021748 | 1/2000 |
| JP | 2004-022708 | 1/2004 |
| JP | 2004-304135 | 10/2004 |
| JP | 2006-147809 | 6/2006 |
| WO | WO 99/49504 | 3/1999 |
| WO | 02/069049 | 9/2002 |
| WO | 2007/094414 | 8/2007 |
| WO | 2007/119466 | 10/2007 |
| WO | WO 2007/138834 A1 | 12/2007 |

OTHER PUBLICATIONS

Office Action for related European Patent Application No. 08 740 775.5-2222, 8 pages, Mar. 15, 2012.

Office Action for related Taiwanese Patent Application No. 097113896, 24 pages, Jul. 31, 2013.

* cited by examiner

PROJECTION OPTICAL SYSTEM, EXPOSURE APPARATUS, AND DEVICE MANUFACTURING METHOD

CROSS-REFERENCE TO RELATED APPLICATIONS

This application claims priority to, and the benefit of, U.S. Provisional Application No. 60/907,828, filed on Apr. 18, 2007, the entire contents of which are incorporated herein by reference.

BACKGROUND

1. Field

An embodiment of the present invention relates to a projection optical system, exposure apparatus, and device manufacturing method.

2. Description of the Related Art

The photolithography process for manufacture of the semiconductor devices and others is carried out using an exposure apparatus for projecting a pattern of a mask (or a reticle) through a projection optical system onto a photosensitive substrate (a wafer or a glass plate coated with a photoresist, or the like). The ordinary exposure apparatus is arranged to form one type of pattern image in one shot area (unit exposure region) on the photosensitive substrate.

In contrast to it, in Japanese Patent Application Laid-open No 2000-21748, the exposure apparatus proposed for improvement in throughput is one using a double exposure method for superimposing two types of patterns in one shot area on the photosensitive substrate to form one synthetic pattern.

SUMMARY

An embodiment of the present invention provides a double-headed projection optical system capable of forming, for example, images of two spaced patterns in parallel in a predetermined region. Another embodiment of the present invention provides an exposure apparatus of the double exposure method capable of superimposing two types of patterns in one shot area on a photosensitive substrate to form one synthetic pattern, using the double-headed projection optical system for forming, for example, images of two spaced patterns in parallel in a predetermined region.

Another embodiment of the present invention provides a projection optical system capable of ensuring the image-side numerical aperture at a required level without increase in the size of the optical system.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides a projection optical system for forming an image of a first surface and an image of a second surface on a third surface, comprising: a first imaging optical system disposed in an optical path between the first surface and a first conjugate point optically conjugate with a point on an optical axis of the first surface; a second imaging optical system disposed in an optical path between the second surface and a second conjugate point optically conjugate with a point on an optical axis of the second surface; a third imaging optical system disposed in an optical path between the third surface and, the first conjugate point and the second conjugate point; a first folding member for guiding light from the first imaging optical system to the third imaging optical system; and a second folding member for guiding light from the second imaging optical system to the third imaging optical system; wherein every optical element having a power in the third imaging optical system is a refractive element, wherein the first conjugate point is located between a surface nearest to the third surface in the first imaging optical system and a surface nearest to the first surface in the third imaging optical system, wherein the second conjugate point is located between a surface nearest to the third surface in the second imaging optical system and a surface nearest to the second surface in the third imaging optical system, wherein the first folding member is disposed between the surface nearest to the third surface in the first imaging optical system and the surface nearest to the first surface in the third imaging optical system, and wherein the second folding member is disposed between the surface nearest to the third surface in the second imaging optical system and the surface nearest to the second surface in the third imaging optical system.

A second embodiment of the present invention provides A projection optical system for forming an image of a first surface on a second surface, comprising: a first imaging optical system disposed in an optical path between the first surface and a conjugate point optically conjugate with a point on an optical axis of the first surface; a second imaging optical system disposed in an optical path between the conjugate point and the second surface; and a folding member for guiding light from the first imaging optical system to the second imaging optical system; wherein every optical element having a power in the first imaging optical system and the second imaging optical system is a refractive element, wherein the conjugate point is located between a surface nearest to the second surface in the first imaging optical system and a surface nearest to the first surface in the second imaging optical system, and wherein the folding member is disposed between the surface nearest to the second surface in the first imaging optical system and the surface nearest to the first surface in the second imaging optical system.

A third embodiment of the present invention provides an exposure apparatus comprising the projection optical system of the first aspect for, based on light from a predetermined pattern set on the first surface, projecting an image of the pattern onto a photosensitive substrate set on the third surface.

A fourth embodiment of the present invention provides an exposure apparatus comprising the projection optical system a of the second aspect for, based on light from a predetermined pattern set on the first surface, projecting an image of the pattern onto a photosensitive substrate set on the second surface.

A fifth embodiment of the present invention provides a device manufacturing method comprising: exposing the photosensitive substrate to the light from the predetermined pattern, using the exposure apparatus of the third embodiment or the fourth embodiment; and developing the exposed photosensitive substrate.

In the double-headed projection optical system of the first embodiment of the present invention, the first imaging optical system forms a first intermediate image based on light from the first object surface, and the third imaging optical system forms a first final image on the image surface, based on light from the first intermediate image. On the other hand, the second imaging optical system forms a second intermediate image based on light from the second object surface located with a spacing from the first object surface, and the third imaging optical system forms a second final image at a position in parallel with the first final image on the image surface, based on light from the second intermediate image.

Since the projection optical system of the first embodiment of the present invention adopts the basic configuration for twice-imaging double-headed projection optical systems as described above, it is able to ensure the image-side numerical aperture and effective imaging area at a required level without increase in the size of the optical system and, for example, to form images of patterns on two object surfaces located with a spacing, in parallel in a predetermined region on the image surface. Therefore, for example, when the projection optical system of the first embodiment of the present invention is applied to the exposure apparatus of the double exposure method, the exposure apparatus is able to form images of patterns on two masks located with a spacing, in parallel in an effective imaging region of the projection optical system, to superimpose two types of patterns in one shot area on a photosensitive substrate to form one synthetic pattern, and, in turn, to manufacture devices at high throughput.

In the projection optical system of the second embodiment of the present invention, the first imaging optical system forms an intermediate image, based on light from the first object surface, and the second imaging optical system forms a final image on the image surface, based on light from the intermediate image. As described above, since the projection optical system of the second embodiment of the present invention adopts the basic configuration for twice-imaging projection optical systems, it is able to ensure the image-side numerical aperture at a required level without increase in the size of the optical system. Since the size of the optical system can be restrained from increasing and the distance between the first surface and the second surface can be made shorter, the vibration can be suppressed in the projection optical systems shown described above. The contrast of the image formed on the second surface can be restrained from lowering in the projection optical system described above by suppression of the vibration. Furthermore, according to the projection optical system of the second embodiment of the present invention, every optical element having a power in the first imaging optical system and the second imaging optical system is a refractive element. Therefore, this projection optical system makes it possible to restrain the increase in the size of the optical system and it can be easy to manufacture this projection optical system. Also, it is possible to manufacture the refractive elements with surface accuracy stable.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
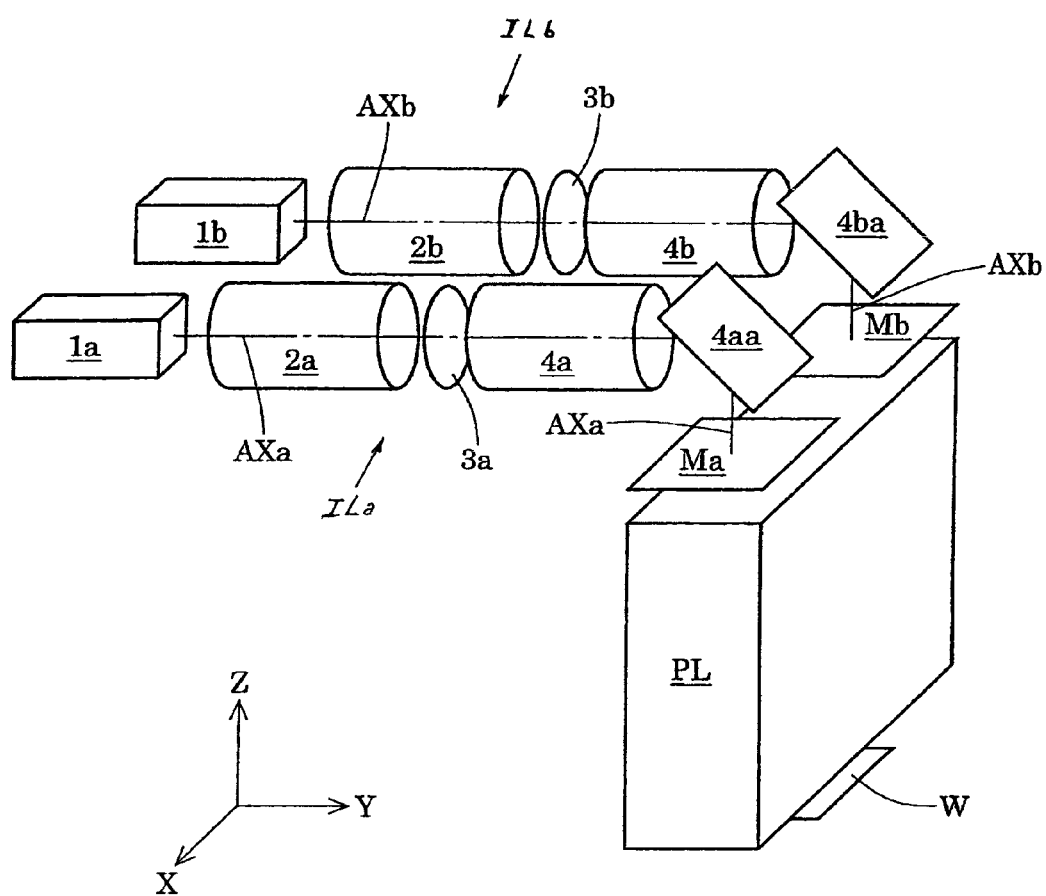
FIG. 1 is a perspective view schematically showing a configuration of an exposure apparatus according to an embodiment of the present invention.

The projection optical system according to an embodiment of the present invention is, for example, a twice-imaging double-headed projection optical system. Specifically, the projection optical system according to the embodiment of the present invention comprises a first imaging optical system disposed in an optical path between a first object surface (first surface) and a first conjugate point optically conjugate with a point on an optical axis of the first object surface; a second imaging optical system disposed in an optical path between a second object surface (second surface) and a second conjugate point optically conjugate with a point on an optical axis of the second object surface; and a third imaging optical system disposed in an optical path between an image surface (third surface) and, the first conjugate point and the second conjugate point.

The first conjugate point is located between a surface nearest to the image surface in the first imaging optical system and a surface nearest to the first object surface in the third imaging optical system. The second conjugate point is located between a surface nearest to the image surface in the second imaging optical system and a surface nearest to the second object surface in the third imaging optical system.

The projection optical system according to the embodiment of the present invention comprises a first folding member disposed near the first conjugate point and adapted to guide light from the first imaging optical system to the third imaging optical system, and a second folding member disposed near the second conjugate point and adapted to guide light from the second imaging optical system to the third imaging optical system, and every optical element having a power in the third imaging optical system is a refractive element. Namely, the third imaging optical system is a refracting optical system. The first folding member is disposed between the surface nearest to the image surface in the first imaging optical system and the surface nearest to the first object surface in the third imaging optical system. The second folding member is disposed between the surface nearest to the image surface in the second imaging optical system and the surface nearest to the second object surface in the third imaging optical system. In this configuration, the first imaging optical system forms a first intermediate image at or near the position of the first conjugate point, based on light from the first object surface, and the third imaging optical system forms a first final image on the image surface, based on light from the first intermediate image. The second imaging optical system forms a second intermediate image at or near the position of the second conjugate point, based on light from the second object surface located with a spacing from the first object surface, and the third imaging optical system forms a second final image at a position in parallel with the first final image on the image surface, based on light from the second intermediate image.

Since the projection optical system according to the embodiment of the present invention adopts the twice-imaging double-headed basic configuration as described above, it is able to ensure the image-side numerical aperture and effective imaging region at a required level without increase in the size of the optical system and, for example, to form images of patterns on the two object surfaces located with a spacing, in parallel in a predetermined region on the image surface. Therefore, for example, when the projection optical system according to the embodiment of the present invention is applied to the exposure apparatus of the double exposure method, the exposure apparatus is able, for example, to form images of patterns on two masks located with a spacing, in parallel in the effective imaging region and to superimpose two types of patterns in one shot area on the photosensitive substrate to form one synthetic pattern.

The double-headed projection optical system according to the embodiment of the present invention may have a reducing rate. In the double-headed projection optical system according to the embodiment of the present invention, the first imaging optical system and the second imaging optical system may be also refracting optical systems as the third imaging optical system is. In other words, every optical element having a power in the first imaging optical system and the second imaging optical system may be a refractive element. The refracting projection optical system in which every optical element having a power is composed of a refractive element is frequently used as a projection optical system for lithography in the conventional exposure apparatus, and is an optical system type applicable to exposure apparatus in terms of reliability and productivity as well.

In the double-headed projection optical system according to the embodiment of the present invention, the first imaging optical system and the second imaging optical system may have the same configuration. This provides an optical system of a configuration symmetrical with respect to the optical axis of the third imaging optical system and achieves improvement in stability of the optical system, simplification of the configuration of the optical system, reduction in production cost of the optical system, and so on.

The double-headed projection optical system according to the embodiment of the present invention can satisfy the following conditions (1) and (2). In the conditions (1) and (2), $\beta 1$ is an imaging magnification of the first imaging optical system, $\beta 2$ an imaging magnification of the second imaging optical system, and $\beta$ a projection magnification of the projection optical system.

$$5 < |\beta 1/\beta| \quad (1)$$

$$5 < |\beta 2/\beta| \quad (2)$$

When the ratio $|\beta 1/\beta|$ is less than the lower limit of Condition (1), the imaging magnification $\beta 1$ of the first imaging optical system may possibly become too small to compensate well for the Petzval sum without degradation of comatic aberration and aspherical aberration and it may possibly become impossible to ensure a large image-side numerical aperture without increase in the radial size of the optical system and to form a flat good image. The lower limit of Condition (1) can be set to 5.5. The upper limit of Condition (1) can be set to 15. When the ratio $|\beta 1/\beta|$ is more than this upper limit, the first folding member may possibly become larger near the forming position of the first intermediate image in order to keep down the curvature of field and, particularly, the total length of the first imaging optical system along the optical path may possibly become too large.

When the ratio $|\beta 2/\beta|$ is less than the lower limit of Condition (2), the imaging magnification $\beta 2$ of the second imaging optical system may possibly become too small to compensate well for the Petzval sum without degradation of comatic aberration and aspherical aberration and it may possibly become impossible to ensure a large image-side numerical aperture without increase in the radial size of the optical system and to form a flat good image. The lower limit of Condition (2) can be set to 5.5. The upper limit of Condition (2) can be set to 15. When the ratio $|\beta 2/\beta|$ is larger than this upper limit, the second folding member may possibly become larger near the forming position of the second intermediate image in order to keep down the curvature of field and, particularly, the total length of the second imaging optical system along the optical path may possibly become too large.

In the double-headed projection optical system according to the embodiment of the present invention, each of the first imaging optical system and the second imaging optical system can be composed of a first lens unit having a positive refracting power, a second lens unit having a negative refracting power, a third lens unit having a positive refracting power, a fourth lens unit having a negative refracting power, and a fifth lens unit having a positive refracting power, in the order named from the entrance side of light. When the 5-unit configuration with the arrangement of positive, negative, positive, negative, and positive refracting powers is adopted for the first imaging optical system and the second imaging optical system in this manner, the Petzval condition can be satisfied without occurrence of various aberrations, particularly, distortion.

The double-headed projection optical system according to the embodiment of the present invention can further comprise a first intermediate folding member disposed in the optical path of the first imaging optical system, and a second intermediate folding member disposed in the optical path of the second imaging optical system, and a distance Li1 on the optical axis between the first folding member and the first intermediate folding member and a distance Li2 on the optical axis between the second folding member and the second intermediate folding member can be set to be at least 130 mm. When this configuration is applied, for example, to the exposure apparatus of the double exposure method, two masks can be arranged with a sufficient spacing so as to avoid mechanical interference.

The double-headed projection optical system according to the embodiment of the present invention can be arranged to have a first effective field region not including the optical axis on the first object surface, and a second effective field region not including the optical axis on the second object surface and to satisfy Conditions (3) and (4) below. In Conditions (3) and (4), LO1 is a spacing between the optical axis and a first effective imaging region formed corresponding to the first effective field region, on the image surface, LO2 a spacing between the optical axis and a second effective imaging region formed corresponding to the second effective field region, on the image surface, and B a maximum image height on the image surface.

$$0.03 < LO1/B < 0.4 \quad (3)$$

$$0.03 < LO2/B < 0.4 \quad (4)$$

When the ratio LO1/B is less than the lower limit of Condition (3), the imaging performance of the first intermediate image may possibly become excessively high for suitably separating rays from the first imaging optical system to the third imaging optical system, from rays from the second imaging optical system to the third imaging optical system and the configurations of the first imaging optical system and the third imaging optical system may possibly become more complicated. The lower limit of Condition (3) can be set to 0.05. On the other hand, when the ratio LO1/B is more than the upper limit of Condition (3), it may possibly become difficult to ensure the first effective imaging region at a required level without increase in the size of the optical system. The upper limit of Condition (3) can be set to 0.3.

When the ratio LO2/B is less than the lower limit of Condition (4), the imaging performance of the second intermediate image may possibly become excessively high for suitably separating rays from the second imaging optical system to the third imaging optical system, from rays from the first imaging optical system to the third imaging optical system and the configurations of the second imaging optical system and the third imaging optical system may possibly become more complicated. The lower limit of Condition (4) can be set to 0.05. On the other hand, when the ratio LO2/B is more than the upper limit of Condition (4), it may possibly become difficult to ensure the second effective imaging region at a required level without increase in the size of the optical system. The upper limit of Condition (4) can be set to 0.3.

In the double-headed projection optical system according to the embodiment of the present invention, the optical path between the projection optical system and the image surface can be filled with a liquid. By adopting the liquid immersion type configuration in which a liquid immersion region is formed on the image side, it becomes feasible to ensure a large effective image-side numerical aperture and also ensure a relatively large effective imaging region.

In the double-headed projection optical system according to the embodiment of the present invention, a ridgeline made by a reflecting surface of the first folding member and a reflecting surface of the second folding member can be located on a point where the optical axes of the first to third imaging optical systems intersect. More precisely, a ridgeline made by a virtual extension of the flat reflecting surface of the first folding member and a virtual extension of the flat reflecting surface of the second folding member can be located on a point where the exit-side optical axis of the first imaging optical system, the exit-side optical axis of the second imaging optical system, and the entrance-side optical axis of the third imaging optical system intersect. In this case, the first folding member and the second folding member are able to suitably separate the rays from the first imaging optical system to the third imaging optical system and the rays from the second imaging optical system to the third imaging optical system.

In the double-headed projection optical system according to the embodiment of the present invention, the first surface and the second surface may be set on a same surface.

An embodiment of the present invention will be described on the basis of the accompanying drawings. FIG. 1 is a perspective view schematically showing a configuration of an exposure apparatus according to the embodiment of the present invention. In FIG. 1, the Z-axis is defined along a direction of a normal to a wafer W being a photosensitive substrate, and the X-axis and Y-axis are defined along directions perpendicular to each other in the surface of the wafer W. With reference to FIG. 1, the exposure apparatus of the present embodiment comprises two illumination systems ILa and ILb having their respective optical axes AXa and AXb set along the YZ plane (plane parallel to the Y-direction and normal to the X-direction).

Since the first illumination system ILa and the second illumination system ILb arranged in parallel have the same configuration, the configuration and action of each illumination system will be described with focus on the first illumination system ILa, with the reference symbol of the second illumination system and reference symbols of components corresponding thereto, in parentheses. The first illumination system ILa (second illumination system ILb) has a first optical system 2a (2b), a fly's eye lens (or a micro fly's eye lens) 3a (3b), and a second optical system 4a (4b).

A light source 1a (1b) which supplies exposure light (illumination light to the first illumination system ILa (second illumination system ILb) can be, for example, an ArF excimer laser light source for supplying light with the wavelength of about 193 nm, or a KrF excimer laser light source for supplying light with the wavelength of about 248 nm. A nearly parallel beam emitted from the light source 1a (1b) travels through the first optical system 2a (2b) to enter the fly's eye lens 3a (3b). The first optical system 2a (2b) has, for example, a beam transmission system (not shown) having a well-known configuration, a polarization state varying section (not shown), and so on. The beam transmission system has functions to guide the incident beam to the polarization state varying section while converting it into a beam having a cross section of appropriate size and shape, and to actively compensate for positional variation and angular variation of the beam incident to the polarization state varying section.

The polarization state varying section has a function to change a polarization state of the illumination light incident to the fly's eye lens 3a (3b). Specifically, the polarization state varying section is composed, for example, of a half wave plate of rock crystal, an angle deviation prism of rock crystal, or rock crystal prism, and an angle deviation prism of silica glass, or silica glass prism. The half wave plate, rock crystal prism, and silica prism are arranged as rotatable each around the optical axis AXa (AXb). The rock crystal prism has the depolarizing action and the silica prism has a function to correct for curves of rays due to the angle deviation action of the rock crystal prism.

By appropriately setting the direction of the crystallographic axis of the half wave plate and the direction of the crystallographic axis of the rock crystal prism, the polarization state varying section converts the linearly polarized light incident from the beam transmission system, into linearly polarized light with a different vibration direction, or converts the incident linearly polarized light into unpolarized light, or emits the incident linearly polarized light directly without conversion. The beam subjected to the conversion of the polarization state according to need by the polarization state varying section is then incident to the fly's eye lens 3a (3b).

The beam incident to the fly's eye lens 3a (3b) is two-dimensionally split by a large number of microscopic lens elements to form small light sources on the rear focal plane of the respective microscopic lens elements to which the beam is incident. A substantial surface illuminant consisting of the large number of small light sources is formed on the rear focal plane of the fly's eye lens 3a (3b) in this manner. Beams from the fly's eye lens 3a (3b) are guided through the second optical system 4a (4b) to the first mask Ma (second mask Mb).

The second optical system 4a (4b) has, for example, a condenser optical system (not shown) having a well-known configuration, a mask blind (not shown), an imaging optical system (not shown), a path folding reflector 4aa (4ba), and so on. In this case, the beams from the fly's eye lens 3a (3b) travel through the condenser optical system to illuminate the mask blind in a superimposed manner. An illumination field of a rectangular shape according to the shape of each microscopic lens element forming the fly's eye lens 3a (3b) is formed on the mask blind as an illumination field stop.

Beams having passed through a rectangular aperture (light transmitting portion) of the mask blind travel via the imaging optical system and path folding reflector 4aa (4ba) to illuminate the first mask Ma (second mask Mb) in a superimposed manner. An aperture stop (not shown) for limiting the beams from the fly's eye lens 3a (3b) is located near the exit surface of the fly's eye lens 3a (3b). The aperture stop has a function to change the size and shape of light intensity distribution near the exit surface of the fly's eye lens 3a (3b), i.e., on the illumination pupil (which will be referred to hereinafter as "pupil intensity distribution").

Figure 2:
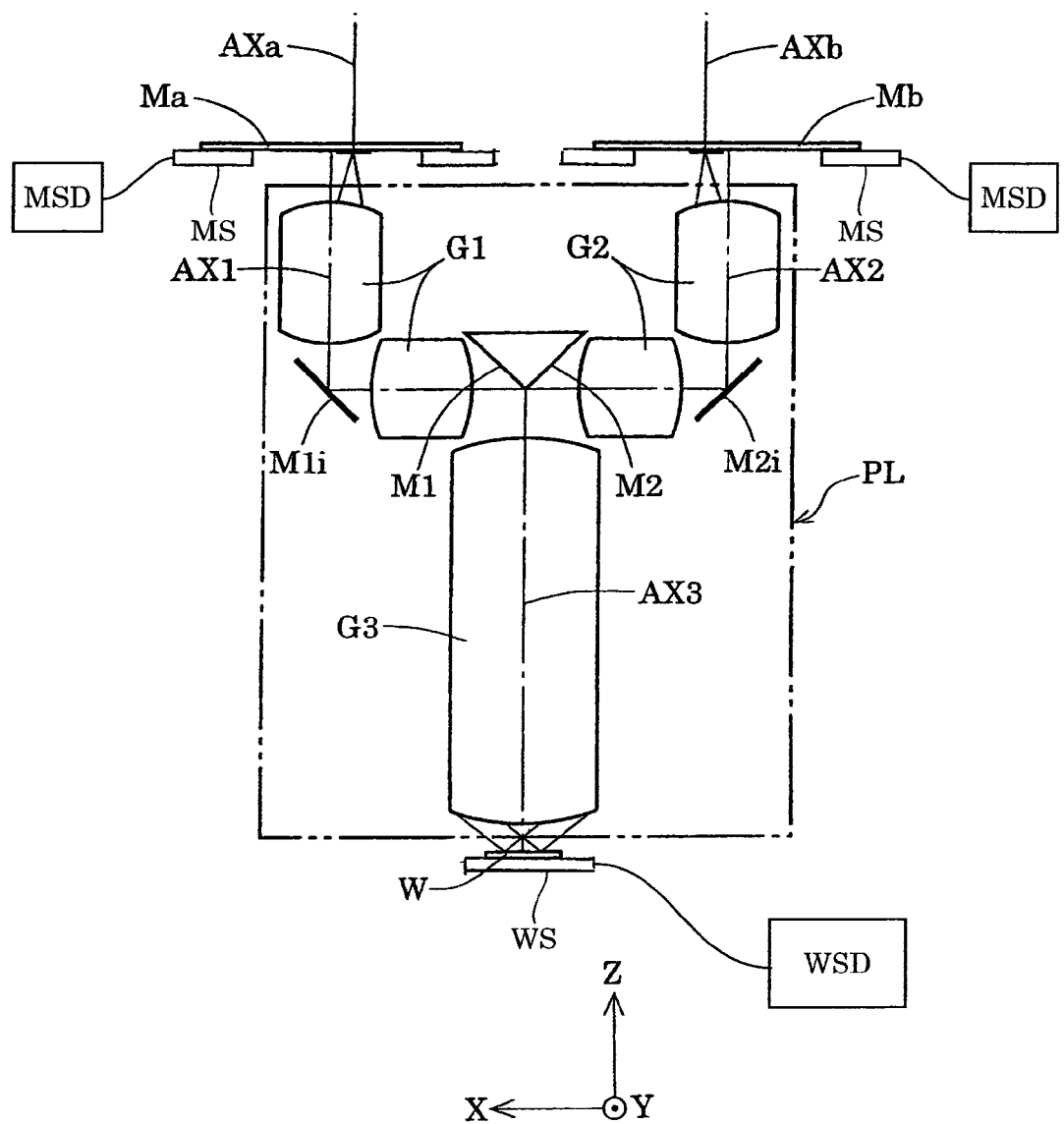
FIG. 2 is a drawing schematically showing the relationship between a double-headed projection optical system and two masks in the embodiment.

A beam through the first mask Ma and a beam through the second mask Mb travel, as shown in FIG. 2, through the double-headed projection optical system PL to form a pattern image of the first mask Ma and a pattern image of the second mask Mb, respectively, on the wafer (photosensitive substrate) W. Each of the first mask Ma and the second mask Mb is put on a mask stage MS, as shown in FIG. 2. The mask stage MS is connected to the mask stage driving system MSD. The mask stage driving system MSD drives the mask stage MS in X-direction, Y-direction, and the direction of rotation around Z-direction. The wafer W is put on a wafer stage WS, as shown in FIG. 2. The wafer stage WS is connected to the wafer stage driving system WSD. The wafer stage driving system WSD drives the wafer stage WS in X-direction, Y-direction, Z-direction, and the direction of rotation around Z-direction. The double-headed projection optical system PL is an optical system having two effective fields separated from each other along the X-direction, and one effective imaging region. The internal configuration of the double-headed projection optical system PL will be described hereinbelow.

Figure 3A:
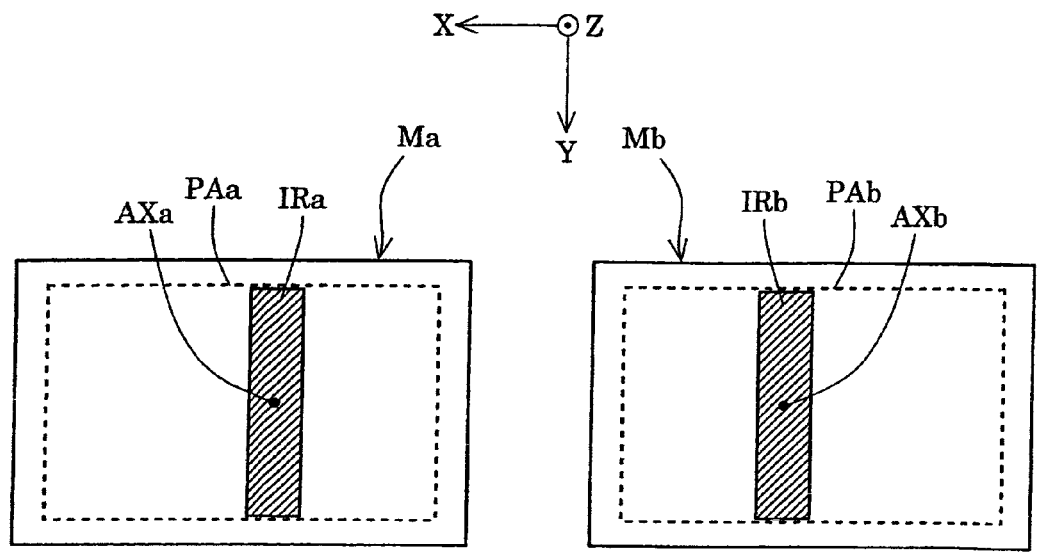
FIG. 3A is a drawing showing rectangular illumination regions formed on a first mask and on a second mask, respectively.

In the present embodiment, the first illumination system ILa forms an illumination region IRa of a rectangular shape elongated in the Y-direction on the first mask Ma, as shown on the left side in FIG. 3A. The second illumination system ILb forms an illumination region IRb of a rectangular shape elongated in the Y-direction on the second mask Mb, as shown on the right side in FIG. 3A. The first illumination region IRa and the second illumination region IRb are formed, for example, as centered on the optical axis AXa of the first illumination system ILa and on the optical axis AXb of the second illumination system ILb, respectively.

Namely, a pattern corresponding to the first illumination region IRa in a pattern region PAa of the first mask Ma is illuminated under an illumination condition defined by the polarization state set by the polarization state varying section in the first illumination system ILa and by the size and shape of pupil intensity distribution set by the aperture stop. Moreover, a pattern corresponding to the second illumination region IRb in a pattern region PAb of the second mask Mb separated with a spacing from the first mask Ma along the X-direction is illuminated under an illumination condition defined by the polarization state set by the polarization state varying section in the second illumination system ILb and by the size and shape of pupil intensity distribution set by the aperture stop.

Figure 3B:
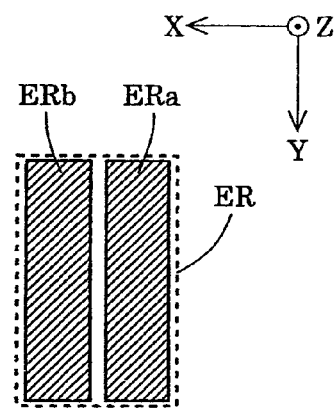
FIG. 3B is a drawing showing a pattern image of the first mask and a pattern image of the second mask formed through the projection optical system.

In this manner, as shown in FIG. 3B, a pattern image of the first mask Ma illuminated by the first illumination region IRa is formed in a first region (first effective imaging region) ERa of a rectangular shape elongated in the Y-direction in an effective imaging region ER of the projection optical system PL, and a pattern image of the second mask Mb illuminated by the second illumination region IRb is formed in a second region (second effective imaging region) ERb having the same contour of the rectangular shape elongated in the Y-direction in the effective imaging region ER and located in parallel with the first region ERa along the X-direction. More specifically, when the projection optical system PL is viewed from top along the Z-direction being the vertical direction, the pattern image of the first illumination region IRa of the first mask Ma and the pattern image of the second illumination region IRb of the second mask Mb are formed in parallel in the region between the first illumination region IRa formed by the first illumination system ILa and the second illumination region IRb formed by the second illumination system ILb.

In the present embodiment, while the first mask Ma, the second mask Mb and the wafer W are synchronously moved in the same direction along the X-direction relative to the projection optical system PL, the pattern of the first mask Ma and the pattern of the second mask Mb are doubly transferred by scanning exposure into one shot area on the wafer W to form one synthetic pattern. Then the foregoing double scanning exposure is repeated with two-dimensional step movement of the wafer W along the XY plane relative to the projection optical system PL, whereby the synthetic pattern of the pattern of the first mask Ma and the pattern of the second mask Mb is sequentially formed in each of shot areas on the wafer W.

Figure 4:
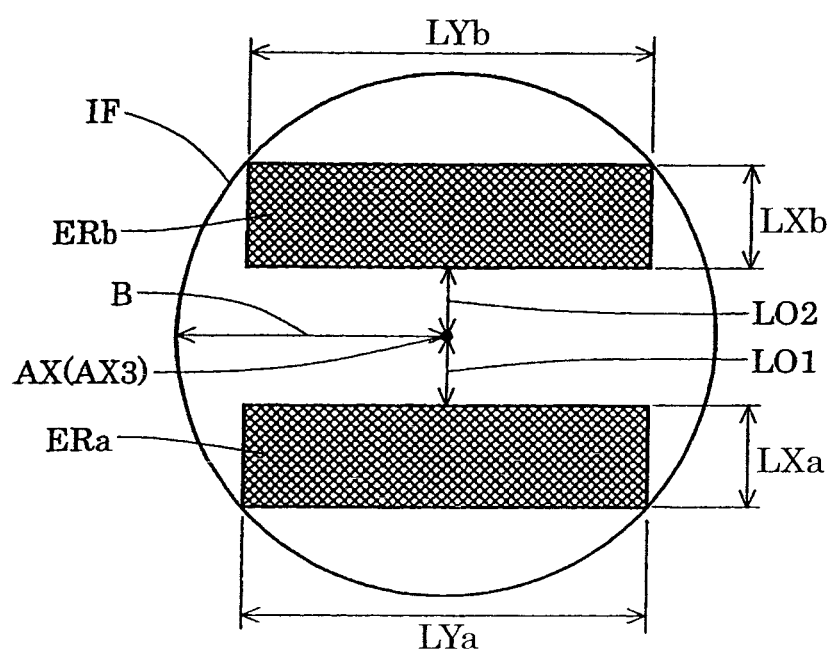
FIG. 4 is a drawing showing the positional relationship between rectangular still exposure regions formed on a wafer, and a reference optical axis in the embodiment.

FIG. 4 is a drawing showing the positional relationship between the reference optical axis and rectangular still exposure regions formed on the wafer in the present embodiment. In the present embodiment, as shown in FIG. 4, a rectangular first still exposure region (corresponding to the first effective imaging region) ERa having a predetermined size is set at a position distant by an off-axis amount LO1 in the −X-direction from the reference optical axis AX and a rectangular second still exposure region (corresponding to the second effective imaging region) ERb having a predetermined size is set at a position distant by an off-axis amount LO2 in the +X-direction from the reference optical axis AX, in a circular region (image circle) IF centered on the reference optical axis AX (coincident with the optical axis AX3 on the wafer W) and having a radius B. The first still exposure region ERa and the second still exposure region ERb are symmetrical with respect to an axial line passing the reference optical axis AX and being parallel to the Y-axis.

The still exposure regions ERa, ERb have their respective X-directional lengths LXa, LXb (=LXa) and their respective Y-directional lengths LYa, LYb (=LYa). Therefore, as shown in FIG. 3A, the rectangular first illumination region (corresponding to the first effective field region) IRa having the size and shape corresponding to the first still exposure region ERa is formed corresponding to the rectangular first still exposure region ERa and at a position separated by a distance corresponding to the off-axis amount LO1 in the −X-direction from the optical axis AX1, on the first mask Ma. Similarly, the rectangular second illumination region (corresponding to the second effective field region) IRb having the size and shape corresponding to the second still exposure region ERb is formed corresponding to the rectangular second still exposure region ERb and at a position separated by a distance corresponding to the off-axis amount LO2 (=LO1) in the +X-direction from the optical axis AX2, on the second mask Mb.

Figure 5:
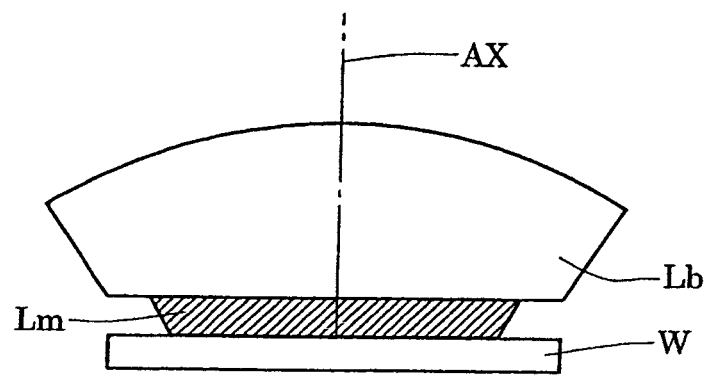
FIG. 5 is a drawing schematically showing a configuration between a boundary lens and a wafer in the embodiment.

FIG. 5 is a drawing schematically showing a configuration between a boundary lens and a wafer in the present embodiment. With reference to FIG. 5, the optical path between the boundary lens Lb and the wafer W is filled with a liquid Lm in the double-headed projection optical system PL of the present embodiment. In the present embodiment, the liquid Lm is pure water (deionized water) which is readily available in large volume in semiconductor manufacturing facilities and others. It is, however, noted that the liquid Lm can also be water containing $H^+$, $Cs^+$, $K^+$, $Cl^-$, $SO_4^{2-}$, or $PO_4^{2-}$, isopropanol, glycerol, hexane, heptane, or decane.

In the exposure apparatus of the step-and-scan method for implementing scanning exposure with relative movement of the wafer W to the projection optical system PL, the liquid Lm can be kept filling the optical path between the boundary lens Lb of the projection optical system PL and the wafer W from beginning to end of the scanning exposure, for example, by applying the technology disclosed in International Publication WO99/49504, the technology disclosed in Japanese Patent Application Laid-open No. 10-303114, or the like. In the technology disclosed in International Publication WO99/49504, a liquid supply device supplies the liquid controlled at a predetermined temperature, through a supply tube and a discharge nozzle so as to fill the optical path between the boundary lens Lb and the wafer W, and a liquid recovery device recovers the liquid through a recovery tube and an inflow nozzle from on the wafer W.

Figure 14:
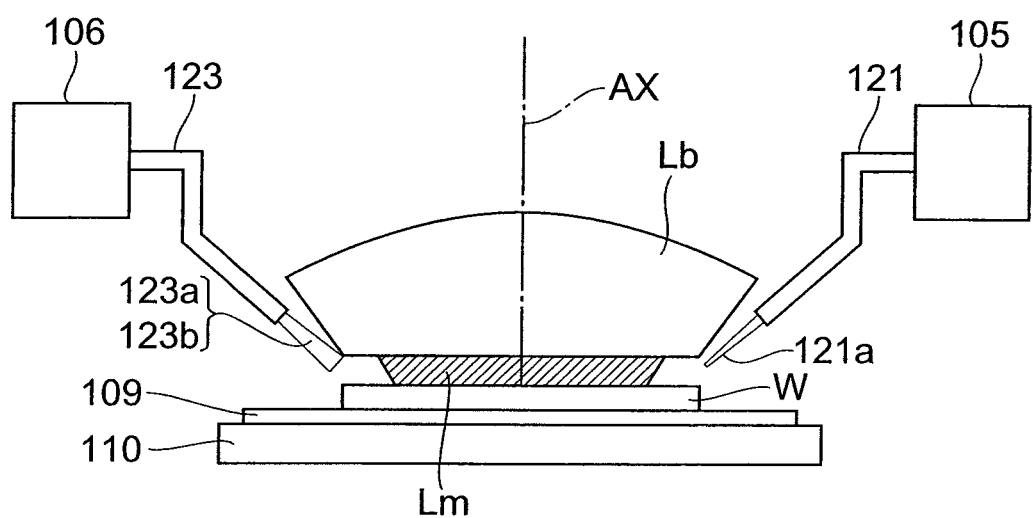
FIG. 14 is a drawing schematically showing a configuration between a boundary lens and a wafer in an example of the embodiment.

FIG. 14 is a drawing schematically showing a configuration between a boundary lens and a wafer in an example of the embodiment when applying the technology disclosed in International Publication WO99/49504. The wafer W is fixed on a Z stage 109 that controls the focus position (position in the Z direction) and tilt angle of the wafer W via a wafer holder (not illustrated). The Z stage 109 is fixed on a XY stage 110 that moves along the XY plane that is essentially parallel to the image surface of the projection optical system PL.

Specifically, this liquid Lm is supplied in a temperature controlled state onto wafer W via a predetermined discharge nozzle, etc. by a liquid supply device 105 consisting of a tank for the liquid, a pressurization pump, and a temperature control device, etc., and using a liquid recovery device 106 consisting of the liquid tank and a suction pump, etc., the liquid is recovered from on wafer W via a predetermined inflow nozzle, etc. The temperature of the liquid Lm is set at about the level of the temperature within the chamber in which the projection exposure apparatus of this example is housed, for example. And, a fine-end tip discharge nozzle 121 a and two expanded-end inflow nozzles 123a and 123b (see FIG. 15) are arranged so as to sandwich the end of the lens Lb of projection optical system PL in the X direction, and the discharge nozzle 121 a is connected to the liquid supply device 105 via a supply pipe 121 while the inflow nozzles 123a and 123b are connected to the liquid recovery device 106 via a recovery pipe 123. Furthermore, there are also two pairs of discharge nozzles and inflow nozzles arranged so as to sandwich in the Y direction the end of the lens Lb and a pair of nozzles placed at the location where the pair of discharge nozzles 121 a and the inflow nozzles 123a and 123b would be if it were rotated by about 180°.

Figure 15:
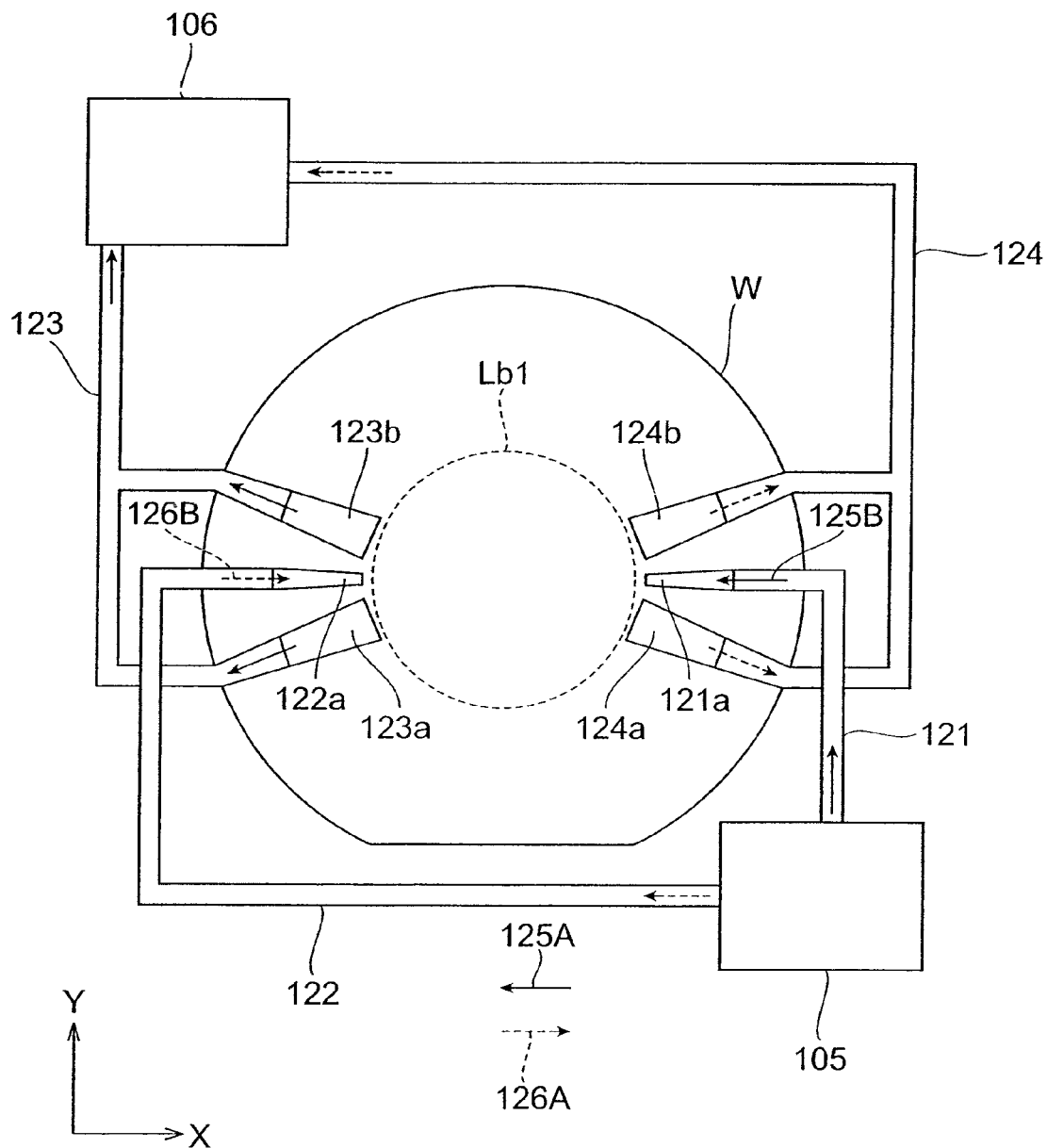
FIG. 15 is a drawing showing the positional relationship of an end of the boundary lens of the projection optical system in FIG. 14 and a discharge nozzle as well as an inflow nozzle.

FIG. 15 shows the positional relationship of the end Lb1 of the lens Lb of projection optical system PL and wafer W of FIG. 14, and the two pairs of discharge nozzles and inflow nozzle that sandwich this end Lb1 in the X direction, and in this FIG. 15, the discharge nozzle 121 a is arranged on the +X direction side of end Lb1 while the inflow nozzles 123a and 123b are arranged on the −X direction side. Also, the inflow nozzles 123a and 123b are arranged in a form that opens like a fan in relation to the axis that is parallel to the X axis through the center of end Lb1. Then, at the location where the pair of discharge nozzles 121 a and the inflow nozzles 123a and 123b would be if it were rotated by about 180°, a separate pair of discharge nozzles 122a and inflow nozzles 124a and 124b are arranged with a discharge nozzle 122a connected to the liquid supply device 105 via a supply pipe 122 and the inflow nozzles 124a and 124b connected to the liquid recovery device 106 via a recovery pipe 124.

Figure 16:
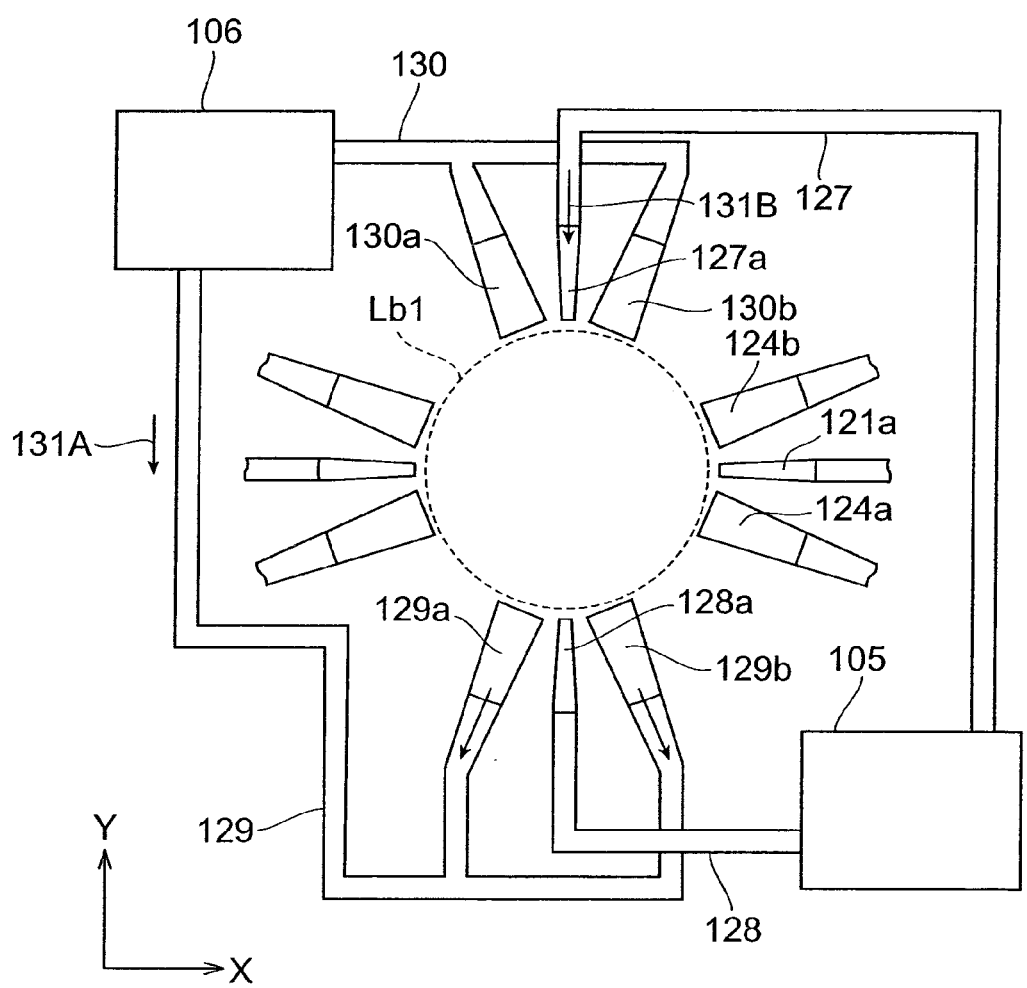
FIG. 16 is a drawing showing the positional relationship of the end of the boundary lens of the projection optical system in FIG. 14 and the discharge nozzle and the inflow nozzle for supplying and recovering a liquid.

Also, FIG. 16 shows the positional relationship of end Lb1 of the lens Lb of projection optical system PL of FIG. 14 and the two pairs of discharge nozzles and inflow nozzles that sandwich this end Lb1 in the Y direction, and in this FIG. 16, a discharge nozzle 127a is arranged in the +Y direction side of end Lb1, while inflow nozzles 129a and 129b are arranged in the −Y direction side, with the discharge nozzle 127a connected to the liquid supply device 105 via a supply pipe 27 and the inflow nozzles 129a and 129b connected to the liquid recovery device 106 via a recovery pipe 129. Also, a separate pair discharge nozzle 128a and the inflow nozzles 129a and 129b are arranged at the location where pair of discharge nozzles 27a and the inflow nozzles 129a and 129b would be if it were rotated by about 180°, and the discharge nozzle 128a is connected to the liquid supply device 105 via a supply pipe 128 and inflow nozzles 130a and 130b are connected to the liquid recovery device 106 via a recovery pipe 130. The liquid supply device 105 supplies temperature-controlled liquid between end Lb1 of the lens Lb and wafer W via at least one of supply pipes 121, 122, 127 and 128, and the liquid recovery device 106 recovers that liquid via at least one of recovery pipes 123, 124, 129 and 130.

Next, we will explain the methods for supplying and recovering the liquid Lm.

In FIG. 15, when moving wafer W in steps in the direction of arrow 125A (−X direction) shown by the solid line, the liquid supply device 105 supplies the liquid Lm between end Lb1 of the lens Lb and wafer W via the supply pipe 121 and the discharge nozzle 121a. Then, the liquid recovery device 106 recovers the liquid Lm from on wafer W via the recovery pipe 123 and the inflow nozzles 123a and 123b. At this time, the liquid Lm flows in the direction of arrow 125B (−X direction) on wafer W, and there is stable filling of the liquid Lm in between wafer W and the lens Lb.

Meanwhile, when moving wafer W in steps in the direction of arrow 126A (+X direction) shown by the dot-dash line, the liquid supply device 105 supplies the liquid Lm between end Lb1 of the lens Lb and wafer W using the supply pipe 122 and the discharge nozzle 122a, and the liquid recovery device 106 recovers the liquid Lm using the recovery pipe 124 and the inflow nozzles 124a and 124b. At this time, the liquid Lm flows on wafer W in the direction of arrow 126B (+X direction), and the space between wafer W and the lens Lb is filled with the liquid Lm. In this way, with the projection exposure apparatus of this example, because two pairs of discharge nozzles and inflow nozzles that are reverse to each other in the X direction are provided, even when wafer W moves in either the +X direction or the −X direction, it is possible to continue filling the space between wafer W and the lens Lb stably with the liquid Lm.

Also, because the liquid Lm flows over wafer W, even in cases when particles (including scattered particles from the resist) adhere on wafer W, there is the advantage that it is possible to remove the particles by the flow of the liquid Lm. Also, because the liquid Lm is adjusted to a predetermined temperature by the liquid supply device 105, temperature of the wafer W surface is adjusted, and this prevents a degradation of overlay accuracy, etc. due to thermal expansion of the wafer due to heat that is generated during exposure. Therefore, even when there is a time difference with alignment and exposure as with alignment using the EGA (enhanced global alignment) method, it is possible to prevent a degradation of overlay accuracy due to thermal expansion of the wafer. Also, with the projection exposure apparatus of this example, the liquid Lm flows in the same direction as the direction that wafer W is moved, so it is possible to recover liquid that has absorbed particles and heat without it pooling on the exposure area directly under end Lb1 of the lens Lb.

Also, when moving wafer W in steps in the Y direction, supply and recovery of the liquid Lm is done from the Y direction.

Specifically, when moving wafer W in steps in the direction of arrow 131A (−Y direction) shown by the solid line in FIG. 16, the liquid supply device 105 supplies liquid via the supply pipe 127 and the discharge nozzle 127a, and the liquid recovery device 106 recovers liquid using the recovery pipe 129 and the inflow nozzles 129a and 129b, and the liquid flows in the direction of arrow 131B (−Y direction) over the exposure area directly under end Lb1 of the lens Lb. Also, when moving the wafer in steps in the +Y direction, liquid is supplied and recovered using the supply pipe 128, the discharge nozzle 128a, the recovery pipe 130, and the inflow nozzles 130a and 130b, and the liquid flows in the +Y direction over the exposure area directly under end Lb1. By doing this, as when wafer W is moving in the X direction, even when wafer W is moving in either the +Y direction or the −Y direction, it is possible to fill the space between wafer W and end Lb1 of the lens Lb with the liquid Lm.

Moreover, rather than only using nozzles that perform supply and recovery of the liquid Lm from the X direction or Y direction, it is also acceptable to provide a nozzle for performing supply and recovery of the liquid Lm from a diagonal direction, for example.

Figure 17:
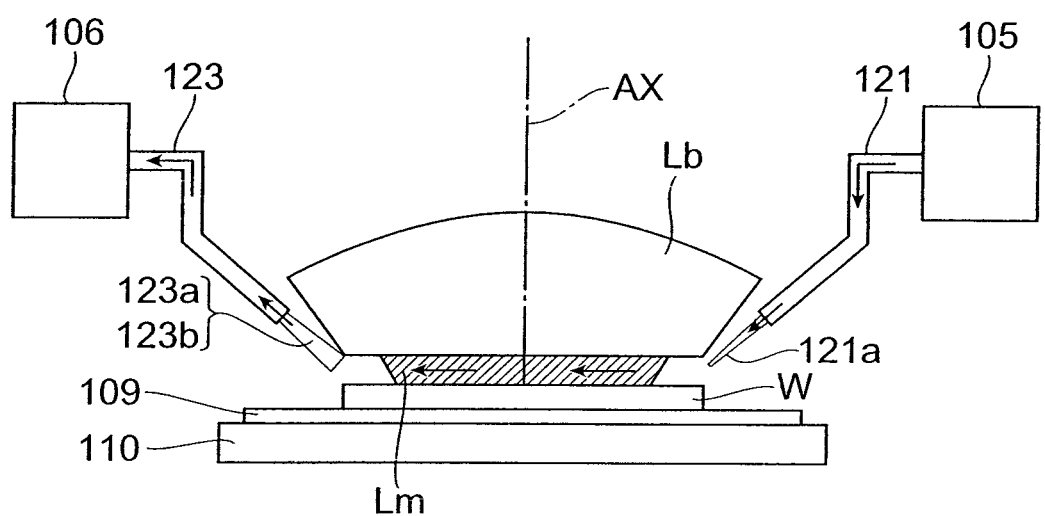
FIG. 17 is an enlarged view of the key portion showing the way the liquid is supplied to and recovered from the space between the boundary lens and the wafer in FIG. 14.

FIG. 17 shows the situation of supply and recovery of the liquid Lm to the space between the lens Lb of the projection optical system PL and the wafer W, and in this FIG. 17, the wafer W moves in the direction of arrow 125A (−X direction), and the liquid Lm supplied from the discharge nozzle 121 a flows in the direction of arrow 125B (−X direction), with recovery done by inflow nozzles 123a and 123b.

On the other hand, the technology disclosed in Japanese Patent Application Laid-open No. 10-303114 is to construct a wafer holder table in a container shape capable of storing the liquid, and to position and hold the wafer W (in the liquid) in the center of the internal bottom of the table by vacuum suction. Furthermore, the barrel tip of the projection optical system PL is arranged to reach the interior of the liquid and therefore the wafer-side optical surface of the boundary lens Lb is arranged to be put in the liquid.

Figure 18:
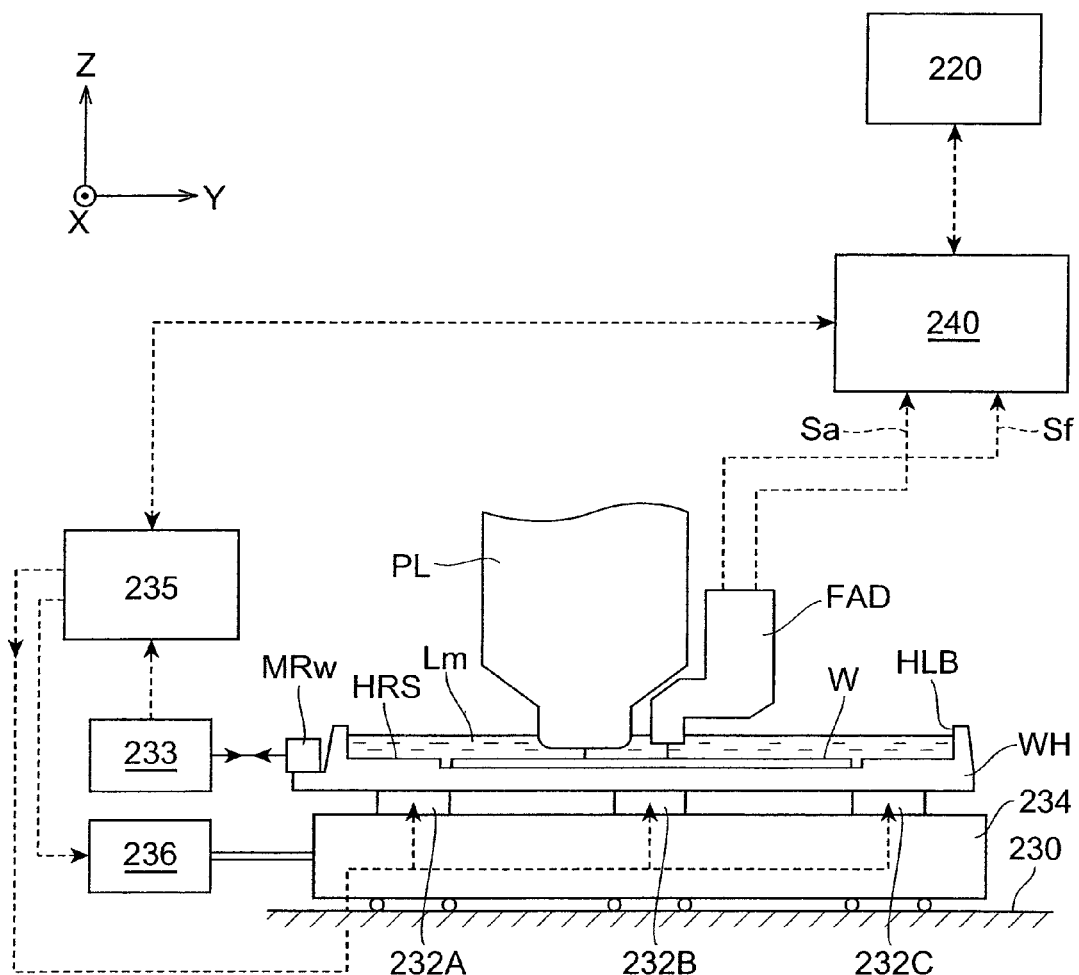
FIG. 18 is a drawing schematically showing a configuration between a boundary lens and a wafer in another example of the embodiment.

FIG. 18 is a drawing schematically showing a configuration between a boundary lens and a wafer in an example of the embodiment when applying the technology disclosed in Japanese Patent Application Laid-open No. 10-303114.

The wafer W is held on a holder table WH that draws the back side of the wafer W by suction. A wall HLB is provided at a constant height around the entire perimeter of the holder table WH, and the liquid Lm is filled inside the wall HLB up to a predetermined depth. The wafer W is held by vacuum suction in a depressed portion on the inner bottom of the holder table WH. Further, an annular auxiliary plate HRS is provided around the inner bottom of the holder table WH to surround the perimeter of the wafer W with a predetermined clearance width. The height of the surface of the auxiliary plate HRS is defined to be approximately equal to the height of the surface of a standard type of wafer W drawn by suction on the holder table WH.

In the example, as shown in FIG. 18, since the tip end of the projection lens system PL is immersed in the liquid Lm, the projection lens system PL is designed to render at least its tip end waterproof in order to prevent the liquid from leaking into the lens barrel.

The holder table WH is mounted on an XY stage 234 in such a manner to enable translational movements (including rough and fine movements in the example) in the Z direction along the optical axis AX of the projection lens PL and fine tilt movements with respect to the XY plane perpendicular to the optical axis AX. The XY stage 234 moves two-dimensionally in the X and Y directions on a base 230. The holder table WH is mounted on the XY stage 234 through three Z-actuators 232A, 232B, and 232C. Each of the actuators 232A-C is a mechanism consisting, for example, of a combination of a piezoelastic element, a voice coil motor, a DC motor, and a lift cam. When the three Z-actuators are driven in the Z direction by the same amount, the holder table WH can be translated in parallel in the Z direction (focus direction), while when the three Z-actuators is driven in the Z direction by amounts different from one another, the tilt direction and amount of the holder table WH can be adjusted.

The two-dimensional movement of the XY stage 234 is caused by a drive motor 236, such as a DC motor for rotating a feed screw or a linear motor for generating thrust in a non-contact manner. The drive motor 236 is controlled by a wafer stage controller 235 receiving measured coordinate positions from a laser interferometer 233 for measuring each of X- and Y-positional changes of the reflection surface of a moving mirror MRw fixed to an edge portion of the holder table WH.

In the example, since the working distance of the projection lens PL is so small that the liquid Lm will be filled in a narrow space between the front lens element of the projection lens PL and the wafer W, it is difficult for an obliquely-incident type focus sensor to project a projection beam of light obliquely from above onto the wafer surface corresponding to the projection field of the projection lens system PL. Therefore, in the example, a focus alignment sensor FAD, including an off-axis type focus leveling detection system (having no focus detection point within the projection field of the projection lens system PL) and a mark detection system for detecting alignment marks on the wafer W in an off-axis manner, is arranged as shown in FIG. 18 around the lower end part of the lens barrel of the projection lens system PL.

Based on the focus signal Sf from the focus alignment sensor FAD, a main controller 240 sends the wafer stage controller 235 driving information best suited to each of the three Z-actuators 232A, B, C. The wafer stage controller 235 controls each of the three Z-actuators 232A, B, C to make focus and tilt adjustments to an actually projected area on the wafer W.

The main controller 240 also manages the coordinate position of the XY stage 234 based on the alignment signal Sa from a focus alignment sensor (FAD) to align the relative position of the first mask Ma (the second mask Mb) and the wafer W. Further, when each shot area on the wafer W is scanned and exposed, the main controller 240 performs synchronous control of the mask stage controller 220 and wafer stage controller 235 so that the first mask Ma (the second mask Mb) and the wafer W will move in the Y direction at a constant speed with a speed ratio corresponding to the projection magnification of the projection lens system PL.

Figure 19:
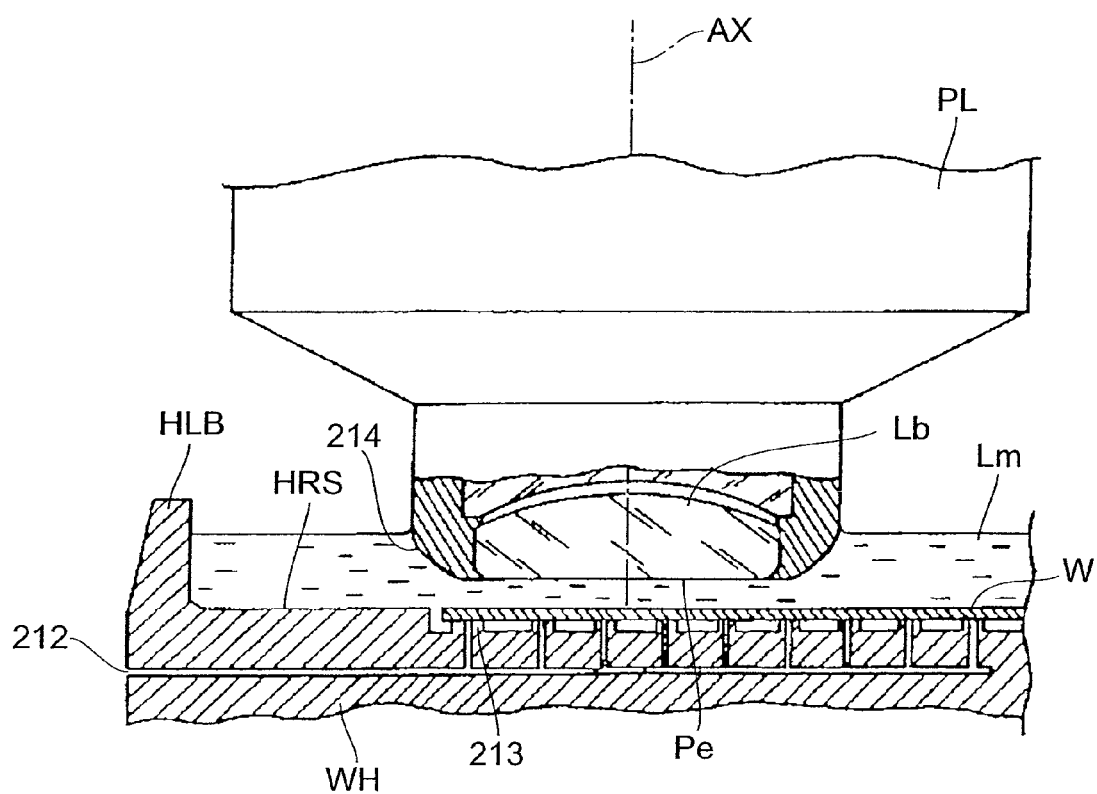
FIG. 19 is a partially sectional view showing a detailed configuration around a projection lens system in FIG. 18.

The state of the liquid Lm in the holder table WH that is a characteristic feature of the exposure apparatus according to the example will be described below with reference to FIG. 19. The hatching is not omitted for the convenience of viewing in FIG. 19 even though the hatchings are omitted for the convenience of viewing in the other drawings. FIG. 19 is a partially sectional view from the tip end of the projection lens system PL to the holder table WH. A positive lens element Lb whose lower face Pe is flat and upper face is convex is fixed at the tip of the projection lens system PL inside the lens barrel. The lower face Pe of the lens element Lb is so finished that the lower face Pe will be flush with the end face of the tip end of the metallic part of the lens barrel (flush surface finishing), preventing the flow of the liquid Lm from becoming turbulent. An outer corner portion 214, which is a portion to be immersed in the liquid Lm at the tip end of the lens barrel of the projection lens system PL, is chamfered, for example, to have a large curvature as shown in FIG. 19, in order reduce resistance against the flow of the liquid Lm and hence to prevent the generation of an unnecessary vortex or turbulent flow. Further, a plurality of protruding suction faces 213 are formed in a central portion of the inner bottom of the holder table WH to draw the back face of the wafer W by vacuum suction. Specifically, these suction faces 213 assume the shape of an annular zone consisting of a plurality of annular land portions having about 1 mm in height and concentrically formed with a predetermined pitch in the direction of the radius of the wafer W. Then, a groove is cut at the center of each of the annular land portions, and each of the grooves is connected to piping 212 inside the table WH, and to a vacuum source for vacuum suction.

In the example, pure water easy to obtain and handle can be used for the liquid Lm.

In the present embodiment, a supply/discharge mechanism is used to circulate the liquid Lm in the optical path between the boundary lens Lb and the wafer W. As the liquid Lm as an immersion liquid is circulated at a small flow rate in this manner, the liquid can be prevented from changing in quality, by effects of antisepsis, mold prevention, and so on. In addition, it can also prevent aberration variation due to absorption of heat of the exposure light.

Figure 6:
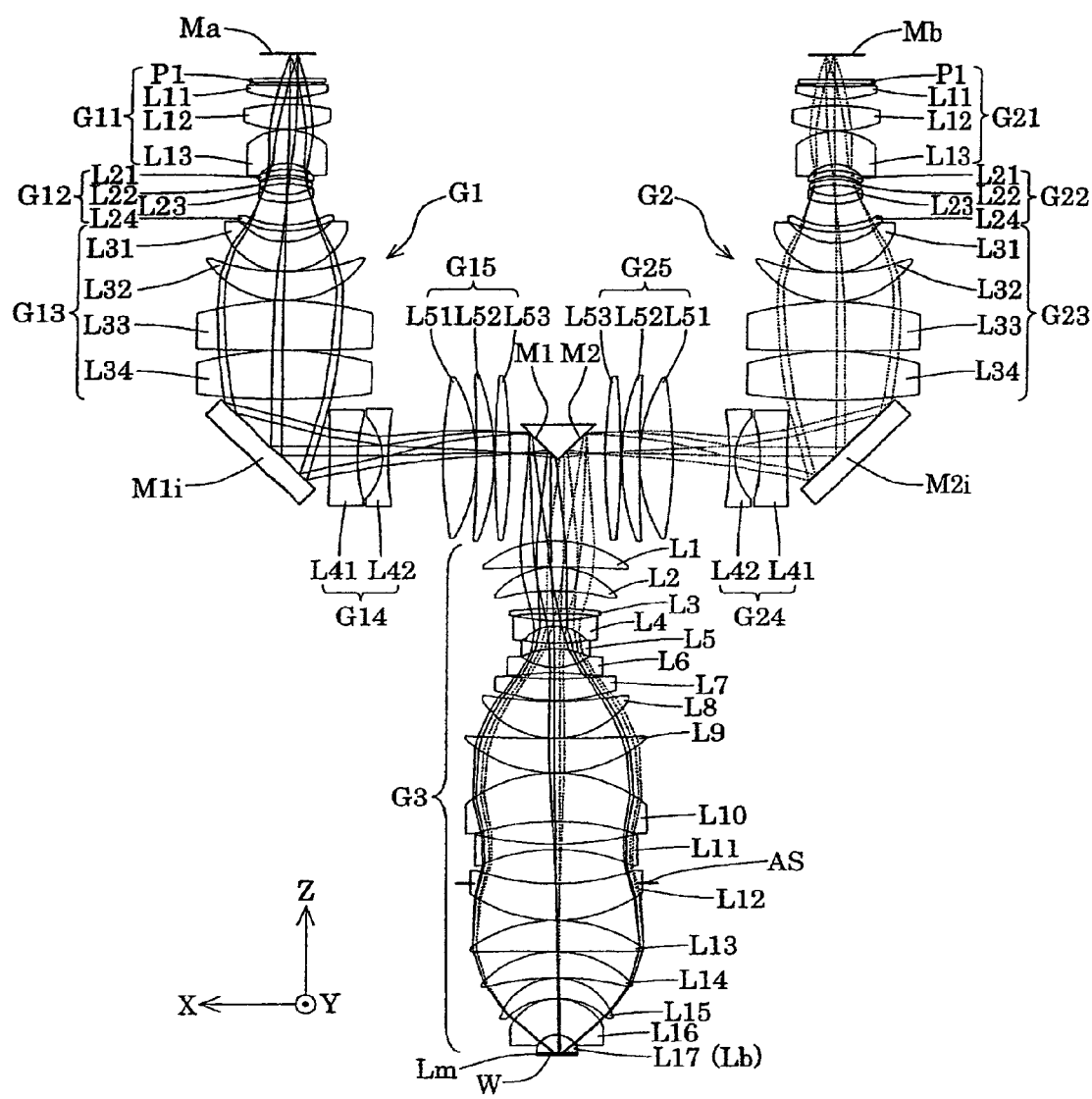
FIG. 6 is a drawing showing a lens configuration of a projection optical system according to an example of the embodiment.

In an example of the present embodiment, the projection optical system PL, as shown in below-described FIG. 6, is composed of a first imaging optical system G1, a second imaging optical system G2, a third imaging optical system G3, a first flat mirror (first folding member) M1, and a second flat mirror (second folding member) M2. The first imaging optical system G1 is disposed in an optical path between the first mask Ma and a first conjugate point optically conjugate with a point on the optical axis of the first mask Ma (the entrance-side optical axis AX1 of the first imaging optical system G1). The second imaging optical system G2 is disposed in an optical path between the second mask Mb and a second conjugate point optically conjugate with a point on the optical axis of the second mask Mb (the entrance-side optical axis AX2 of the second imaging optical system G2). The third imaging optical system G3 is disposed in an optical path between the wafer W and, the first conjugate point and second conjugate point. The first flat mirror M1 is disposed near the first conjugate point and the second flat mirror M2 is disposed near the second conjugate point.

The first imaging optical system G1, the second imaging optical system G2, and the third imaging optical system G3 all are refracting optical systems and the first imaging optical system G1 and the second imaging optical system G2 have the same configuration. Each of the first imaging optical system G1 and the second imaging optical system G2 is composed of a first lens unit G11, G21 having a positive refracting power, a second lens unit G12, G22 having a negative refracting power, a third lens unit G13, G23 having a positive refracting power, a fourth lens unit G14, G24 having a negative refracting power, and a fifth lens unit G15, G25 having a positive refracting power, in the order named from the entrance side of light.

A first intermediate flat mirror (first intermediate folding member) M1*i* is disposed between the third lens unit G13 and the fourth lens unit G14 in the optical path of the first imaging optical system G1 and a second intermediate flat mirror (second intermediate folding member) M2*i* is disposed between the third lens unit G23 and the fourth lens unit G24 in the optical path of the second imaging optical system G2. As shown in FIG. 2, a ridgeline made by a virtual extension of the reflecting surface of the first flat mirror M1 and a virtual extension of the reflecting surface of the second flat mirror M2 is located on the point where the exit-side optical axis AX1 of the first imaging optical system G1, the exit-side optical axis AX2 of the second imaging optical system G2, and the entrance-side optical axis AX3 of the third imaging optical system G3 intersect. The projection optical system PL is virtually telecentric on both of the object side and the image side.

In the projection optical system PL of the example, light traveling from the first mask Ma along the −Z-direction passes through the lens units G11, G12, and G13 in the first imaging optical system G1, is then folded into the −X-direction by the first intermediate flat mirror M1*i*, and travels through the lens units G14 and G15 in the first imaging optical system G1 to form a first intermediate image near the first flat mirror M1. Likewise, light traveling from the second mask Mb along the −Z-direction passes through the lens units G21, G22, and G23 in the second imaging optical system G2, is then folded into the +X-direction by the second intermediate flat mirror M2*i*, and travels through the lens units G24 and G25 in the second imaging optical system G2 to form a second intermediate image near the second flat mirror M2.

The third imaging optical system G3 forms a first final reduced image on the wafer W, based on the light from the first intermediate image, and forms a second final reduced image at a position in parallel with the first reduced image on the wafer W, based on light from the second intermediate image.

In the example of the present embodiment, each aspherical surface is represented by Mathematical Formula (a) below, where y is a height in a direction perpendicular to the optical axis, z a distance (sag) along the optical axis from a tangent plane at a top of the aspherical surface to a position on the aspherical surface at the height y, r a radius of curvature at the top, K a conical coefficient, and Cn an aspherical coefficient of n-th order. In Table (1) presented hereinbelow, each lens surface of an aspherical shape is accompanied with mark * on the right side of a surface number.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+C_{16}\cdot y^{16} \quad (a)$$

EXAMPLES

FIG. 6 is a drawing showing a lens configuration of a projection optical system according to an example of the present embodiment. With reference to FIG. 6, the first lens unit G11 of the first imaging optical system G1 in the projection optical system PL of the example is composed of a positive meniscus lens L11 with a concave surface on the entrance side, a biconvex lens L12, and a negative meniscus lens L13 with a convex surface on the entrance side, in the order named from the entrance side of light. The second lens unit G12 of the first imaging optical system G1 is composed of a negative meniscus lens L21 with a convex surface on the entrance side, a meniscus lens L22 with a convex surface of an aspherical shape on the entrance side, a negative meniscus lens L23 with a concave surface on the entrance side, and a negative meniscus lens L24 with a concave surface on the entrance side, in the order named from the entrance side of light.

The third lens unit G13 of the first imaging optical system G1 is composed of a positive meniscus lens L31 with a concave surface of an aspherical shape on the entrance side, a positive meniscus lens L32 with a concave surface on the entrance side, a biconvex lens L33, and a biconvex lens L34 in the order named from the entrance side of light. The fourth lens unit G14 of the first imaging optical system G1 is composed of a biconcave lens L41 with a concave surface of an aspherical shape on the exit side, and a biconcave lens L42 in the order named from the entrance side of light. The fifth lens unit G15 of the first imaging optical system G1 is composed of a biconvex lens L51 with a convex surface of an aspherical shape on the entrance side, a positive meniscus lens L52 with a concave surface on the entrance side, and a biconvex lens L53 in the order named from the entrance side of light. The second imaging optical system G2 has the same configuration as the first imaging optical system G1, and thus the detailed description of the configuration thereof is omitted herein.

The third imaging optical system G3 is composed of a positive meniscus lens L1 with a convex surface on the entrance side, a positive meniscus lens L2 with a convex surface on the entrance side, a positive meniscus lens L3 with a convex surface on the entrance side, a biconcave lens L4 with a concave surface of an aspherical shape on the entrance side, a biconcave lens L5 with a concave surface of an aspherical shape on the exit side, a biconcave lens L6 with a concave surface of an aspherical shape on the exit side, a positive meniscus lens L7 with a convex surface of an aspheri-cal shape on the exit side, a positive meniscus lens L8 with a concave surface on the entrance side, a positive meniscus lens L9 with a concave surface on the entrance side, a positive meniscus lens L10 with a convex surface on the entrance side, a biconcave lens L11, a positive meniscus lens L12 with a concave surface on the entrance side, a positive meniscus lens L13 with a convex surface on the entrance side, a positive meniscus lens L14 with a concave surface of an aspherical shape on the exit side, a positive meniscus lens L15 with a concave surface of an aspherical shape on the exit side, a negative meniscus lens L16 with a convex surface on the entrance side, and a planoconvex lens L17 (boundary lens Lb) with a plane on the exit side. In the example, the paraxial pupil position is located inside the positive meniscus lens L12 and an aperture stop AS is disposed at this paraxial pupil position. The aperture stop AS may be disposed at one or more positions different in the optical-axis direction from this paraxial pupil position.

In the example, the optical path between the boundary lens Lb and the wafer W is filled with pure water (Lm) having the refractive index of 1.435876 for ArF excimer laser light (wavelength λ=193.306 nm) being used light (exposure light). All the optically transparent members (P1, L11-L13, L21-L24, L31-L34, L41, L42, L51-L53, L1-L17 (Lb)) are made of silica glass (SiO₂) having the refractive index of 1.5603261 for the used light.

Table (1) below provides values of specifications of the projection optical system PL of the example. In the major specifications in Table (1), λ represents the center wavelength of the exposure light, P the magnitude of the projection magnification, NA the image-side (wafer-side) numerical aperture, B the radius (maximum image height) of the image circle IF on the wafer W, LXa and LXb the lengths along the X-direction of the still exposure regions ERa and ERb (lengths of the shorter sides), and LYa and LYb the lengths along the Y-direction of the still exposure regions ERa and ERb (lengths of the longer sides).

In the specifications of the optical members in Table (1), "surface number" represents an order of each surface from the entrance side of light, r the radius of curvature of each surface (the radius of curvature at the top for an aspherical surface: mm), d an axial spacing or surface separation of each surface (mm), φ a clear aperture diameter size of each surface (diameter: mm), and n the refractive index for the center wavelength. Since the second imaging optical system G2 has the same configuration as the first imaging optical system G1, the specifications of the optical members for the second imaging optical system G2 are omitted in Table (1). In the values corresponding to the conditions in Table (1), L1$i$ represents the distance on the optical axis between the flat mirror M1 and the first intermediate flat mirror M1$i$ and Li2 the distance on the optical axis between the flat mirror M2 and the second intermediate flat mirror M2$i$.

TABLE (1)

(Major Specs)

λ = 193.306 nm, β = ¼, NA = 1.20, B = 14 mm
LXa = LXb = 4.2 mm, LYa = LYb = 26 mm (Specs of Optical Members)

| Surface Number | r | d | φ | n | Optical Member |
|---|---|---|---|---|---|
| (mask surface) |  | 51.094891 |  |  |  |
| 1 | ∞ | 8.175182 | 143.7 | 1.5603261 | (P1) |

TABLE (1)-continued

| | | | | |
|---|---|---|---|---|
| 2 | ∞ | 6.131387 | 146.8 | |
| 3 | −1463.73482 | 24.796927 | 149.4 | 1.5603261 (L11) |
| 4 | −259.24325 | 13.452150 | 155.7 | |
| 5 | 436.59865 | 50.376986 | 166.2 | 1.5603261 (L12) |
| 6 | −231.96976 | 1.021898 | 167.8 | |
| 7 | 124.00336 | 67.801652 | 152.2 | 1.5603261 (L13) |
| 8 | 70.41213 | 12.424410 | 103.7 | |
| 9 | 121.37143 | 11.240876 | 103.6 | 1.5603261 (L21) |
| 10 | 109.95358 | 7.194166 | 99.2 | |
| 11* | 155.60037 | 11.551309 | 99.0 | 1.5603261 (L22) |
| 12 | 182.10414 | 22.072039 | 96.5 | |
| 13 | −102.30028 | 16.036540 | 96.2 | 1.5603261 (L23) |
| 14 | −142.98203 | 47.451515 | 104.7 | |
| 15 | −173.58313 | 11.681685 | 166.8 | 1.5603261 (L24) |
| 16 | −211.21285 | 22.967573 | 184.3 | |
| 17* | −121.88701 | 60.221524 | 185.5 | 1.5603261 (L31) |
| 18 | −128.09592 | 1.021898 | 235.9 | |
| 19 | −392.60315 | 58.818133 | 295.2 | 1.5603261 (L32) |
| 20 | −187.70969 | 1.021898 | 305.0 | |
| 21 | 606.67782 | 102.189781 | 339.6 | 1.5603261 (L33) |
| 22 | −3496.83097 | 1.021898 | 339.4 | |
| 23 | 594.87474 | 102.189781 | 337.6 | 1.5603261 (L34) |
| 24 | −1185.58201 | 122.238908 | 321.1 | |
| 25 | ∞ | 91.970803 | 245.8 | (M1i) |
| 26 | −2159.64273 | 53.674028 | 195.9 | 1.5603261 (L41) |
| 27* | 355.27134 | 49.112705 | 177.7 | |
| 28 | −131.25514 | 11.240876 | 177.6 | 1.5603261 (L42) |
| 29 | 676.82273 | 111.114483 | 210.0 | |
| 30* | 780.71326 | 67.136173 | 376.1 | 1.5603261 (L51) |
| 31 | −345.72949 | 1.021898 | 372.6 | |
| 32 | −2844.84158 | 34.580070 | 387.9 | 1.5603261 (L52) |
| 33 | −509.20848 | 2.043796 | 388.6 | |
| 34 | 1739.83703 | 31.144748 | 385.2 | 1.5603261 (L53) |
| 35 | −1118.78325 | 91.970803 | 384.7 | |
| 36 | ∞ | 173.722628 | 341.7 | (M1) |
| 37 | 226.02394 | 54.982019 | 281.9 | 1.5603261 (L1) |
| 38 | 1942.61661 | 1.021898 | 276.1 | |
| 39 | 155.30114 | 48.885484 | 235.5 | 1.5603261 (L2) |
| 40 | 402.04803 | 37.482461 | 222.3 | |
| 41 | 735.15490 | 11.240876 | 174.0 | 1.5603261 (L3) |
| 42 | 788.36653 | 14.842375 | 162.9 | |
| 43* | −310.92400 | 11.240876 | 160.7 | 1.5603261 (L4) |
| 44 | 79.47793 | 36.825969 | 123.8 | |
| 45 | −343.47986 | 11.240876 | 123.9 | 1.5603261 (L5) |
| 46* | 134.60961 | 39.852450 | 130.1 | |
| 47 | −110.25461 | 11.240876 | 131.8 | 1.5603261 (L6) |
| 48* | 311.22495 | 12.916879 | 181.6 | |
| 49 | −908.13971 | 45.318482 | 188.0 | 1.5603261 (L7) |
| 50* | −259.96849 | 1.834731 | 233.8 | |
| 51 | −754.45772 | 77.050464 | 259.4 | 1.5603261 (L8) |
| 52 | −175.95131 | 1.021898 | 282.9 | |
| 53 | −3103.13791 | 72.654086 | 341.7 | 1.5603261 (L9) |
| 54 | −265.83679 | 1.021898 | 348.7 | |
| 55 | 281.70867 | 102.189781 | 347.8 | 1.5603261 (L10) |
| 56 | 516.39802 | 47.023703 | 312.4 | |
| 57 | −670.17561 | 11.241419 | 310.2 | 1.5603261 (L11) |
| 58 | 363.92030 | 73.438554 | 302.8 | |
| 59 | ∞ | −2.567047 | | (AS) |
| 60 | −476.06631 | 75.452298 | 307.0 | 1.5603261 (L12) |
| 61 | −295.97462 | 1.021898 | 330.3 | |
| 62 | 293.15804 | 62.727023 | 334.0 | 1.5603261 (L13) |
| 63 | 16539.35648 | 1.021898 | 329.7 | |
| 64 | 202.58064 | 53.979809 | 298.0 | 1.5603261 (L14) |
| 65* | 501.39136 | 1.021898 | 289.5 | |
| 66 | 119.67915 | 41.514916 | 221.3 | 1.5603261 (L15) |
| 67* | 152.47807 | 1.021898 | 201.0 | |
| 68 | 103.48438 | 72.499275 | 180.1 | 1.5603261 (L16) |
| 69 | 46.75184 | 1.021898 | 79.9 | |
| 70 | 42.95688 | 36.630648 | 76.3 | 1.5603261 (L17:Lb) |
| 71 | ∞ | 6.338758 | 43.1 | 1.435876 (Lm) |
| (wafer surface) | | | | |

(aspherical data)

11th surface: $\kappa = 0$ $C_4 = 1.37393 \times 10^{-8}$     $C_6 = -7.78559 \times 10^{-12}$
$C_8 = 1.98875 \times 10^{-15}$    $C_{10} = -7.94757 \times 10^{-18}$
$C_{12} = 3.96286 \times 10^{-21}$ $C_{14} = -1.06425 \times 10^{-24}$
$C_{16} = 1.03200 \times 10^{-28}$ 17th surface: $\kappa = 0$ $C_4 = -2.59194 \times 10^{-8}$    $C_6 = 8.66157 \times 10^{-13}$
$C_8 = 1.37970 \times 10^{-17}$    $C_{10} = 5.93627 \times 10^{-21}$
$C_{12} = 6.85375 \times 10^{-25}$ $C_{14} = -2.90262 \times 10^{-29}$
$C_{16} = 6.11666 \times 10^{-33}$ 27th surface: $\kappa = 0$ $C_4 = 1.44892 \times 10^{-8}$     $C_6 = 4.21963 \times 10^{-13}$
$C_8 = 2.05550 \times 10^{-17}$    $C_{10} = -7.36804 \times 10^{-22}$
$C_{12} = 1.54488 \times 10^{-25}$ $C_{14} = -2.87728 \times 10^{-30}$
$C_{16} = 0$ 30th surface: $\kappa = 0$ $C_4 = -3.55466 \times 10^{-9}$    $C_6 = -2.75444 \times 10^{-14}$
$C_8 = 7.98107 \times 10^{-19}$    $C_{10} = -1.12178 \times 10^{-23}$
$C_{12} = 1.02335 \times 10^{-28}$ $C_{14} = -4.83517 \times 10^{-34}$
$C_{16} = 0$ 43rd surface: $\kappa = 0$ $C_4 = -3.96417 \times 10^{-8}$    $C_6 = 2.38949 \times 10^{-11}$
$C_8 = -3.60945 \times 10^{-15}$   $C_{10} = 3.38133 \times 10^{-19}$
$C_{12} = -1.95214 \times 10^{-23}$ $C_{14} = 5.34141 \times 10^{-28}$
$C_{16} = 0$ 46th surface: $\kappa = 0$ $C_4 = -3.86838 \times 10^{-8}$    $C_6 = 1.52228 \times 10^{-11}$
$C_8 = -2.61526 \times 10^{-15}$   $C_{10} = 1.58228 \times 10^{-19}$
$C_{12} = -2.06992 \times 10^{-23}$ $C_{14} = -9.75169 \times 10^{-28}$
$C_{16} = 0$ 48th surface: $\kappa = 0$ $C_4 = -1.68578 \times 10^{-7}$    $C_6 = 1.16791 \times 10^{-11}$
$C_8 = -7.98020 \times 10^{-16}$   $C_{10} = 4.50628 \times 10^{-20}$
$C_{12} = -1.93836 \times 10^{-24}$ $C_{14} = 3.72188 \times 10^{-29}$
$C_{16} = 0$ 50th surface: $\kappa = 0$ $C_4 = 4.18393 \times 10^{-8}$     $C_6 = 8.93158 \times 10^{-13}$
$C_8 = -3.08968 \times 10^{-17}$   $C_{10} = -5.18125 \times 10^{-21}$
$C_{12} = 2.79972 \times 10^{-25}$ $C_{14} = -4.07427 \times 10^{-30}$
$C_{16} = 0$ 65th surface: $\kappa = 0$ $C_4 = -2.46119 \times 10^{-9}$    $C_6 = -4.80943 \times 10^{-13}$
$C_8 = 4.23462 \times 10^{-17}$    $C_{10} = -1.44192 \times 10^{-21}$
$C_{12} = 2.64358 \times 10^{-26}$ $C_{14} = -2.03060 \times 10^{-31}$
$C_{16} = 0$ 67th surface: $\kappa = 0$ $C_4 = 7.65330 \times 10^{-9}$     $C_6 = 4.60588 \times 10^{-12}$
$C_8 = -2.33473 \times 10^{-16}$   $C_{10} = 1.90470 \times 10^{-20}$
$C_{12} = -6.40667 \times 10^{-25}$ $C_{14} = 2.75306 \times 10^{-29}$
$C_{16} = 0$ (Values Corresponding to Conditions)

$\beta 1 = \beta 2 = -2.477$, $\beta = 0.25$, LO1 = LO2 = 1.0 mm
B = 14 mm, Li1 = Li2 = 545.01 mm
(1) $|\beta 1/\beta| = 9.909$
(2) $|\beta 2/\beta| = 9.909$
(3) LO1/B = 0.0714
(4) LO2/B = 0.0714

Figure 7:
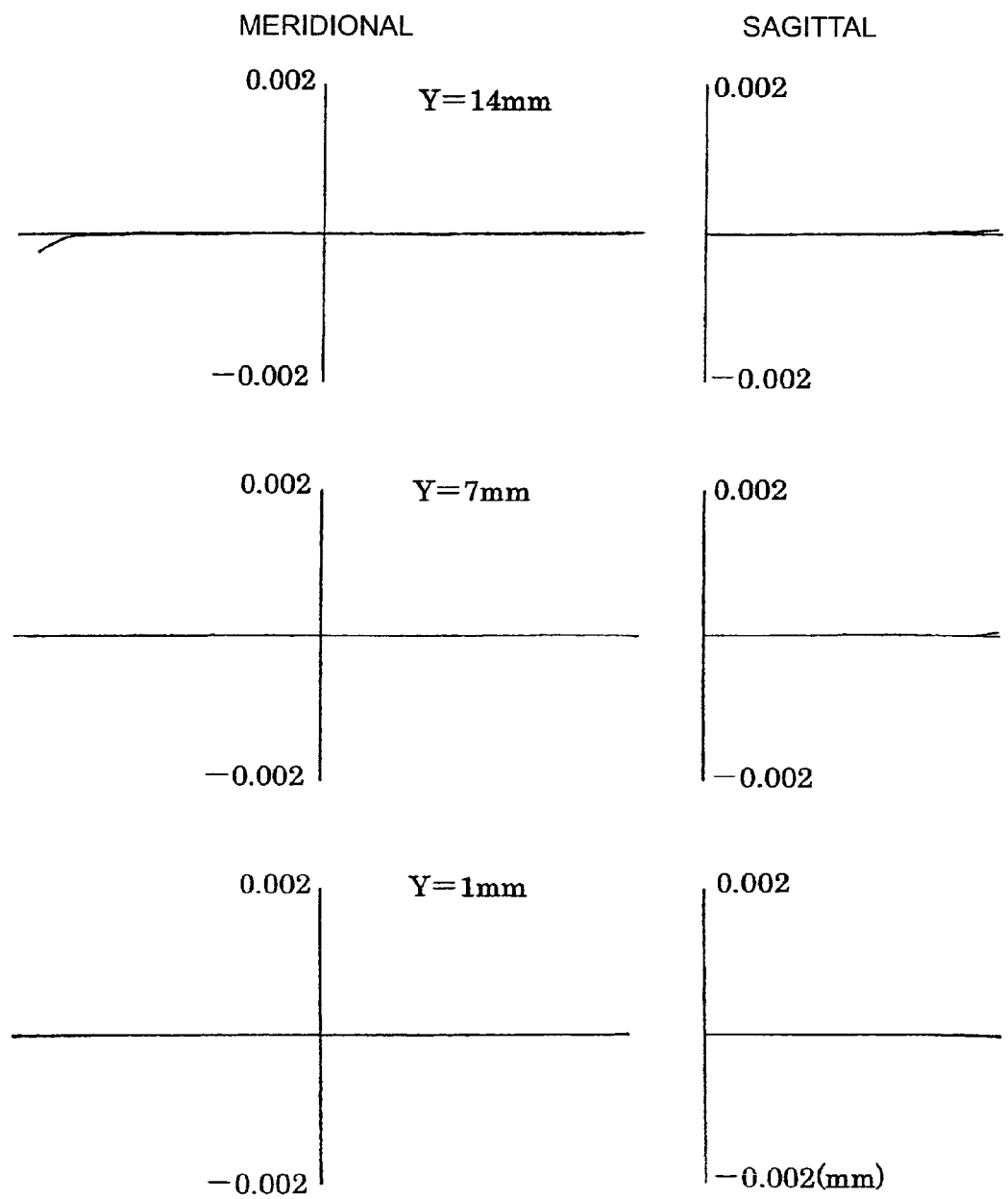
FIG. 7 is a diagram showing the transverse aberration in the projection optical system of the example.

FIG. 7 is a diagram showing the transverse aberration in the example. In the aberration diagram, Y indicates the image height. It is apparent from the aberration diagram of FIG. 7 that the projection optical system in the example is compensated well for the aberration for the excimer laser light at the wavelength of 193.306 nm, while it ensures the very large image-side numerical aperture (NA=1.20) and the relatively large still exposure region ER (26 mm×10.4 mm) including the pair of still exposure regions ERa, ERb (26 mm×4.2 mm).

In the projection optical system PL of the present embodiment, as described above, pure water Lm with the large refractive index is interposed in the optical path between the boundary lens Lb and the wafer W, whereby it ensures the large effective image-side numerical aperture and the relatively large effective imaging region. Namely, the example ensures the high image-side numerical aperture of 1.20 and the pair of rectangular still exposure regions ERa, ERb, for the ArF excimer laser light with the center wavelength of 193.306 nm, and permits the double exposure at a high resolution of a circuit pattern, for example, in the rectangular exposure region of 26 mm×33 mm.

In the example, the first conjugate point and the second conjugate point optically conjugate with the respective points on the optical axis AX1 and the optical axis AX2 of the pattern surfaces (object surfaces) of the masks Ma, Mb are located between the lenses L53 and L1. Namely, the first conjugate point is located between a surface (a surface on the side of the wafer W, of the lens L53) nearest to the wafer W in the first imaging optical system G1 and a surface (a surface on the side of the first mask Ma, of the lens L1) nearest to the first mask Ma in the third imaging optical system G3. The second conjugate point is located between a surface (a surface on the side of the wafer W, of the lens L53) nearest to the wafer W in the second imaging optical system G2 and a surface (a surface on the side of the second mask Mb, of the lens L1) nearest to the second mask Mb in the third imaging optical system G3. Therefore, each imaging optical system is definitely defined as follows: the first imaging optical system G1 as the optical system from the mask Ma to the first conjugate point; the second imaging optical system G2 as the optical system from the mask Mb to the second conjugate point; the third imaging optical system G3 as the optical system from the first conjugate point and the second conjugate point to the wafer W. The following definition can be applied to the embodiment: in cases where a conjugate point optically conjugate with the point on the optical axis of the object surface is located in an optical element (e.g., a lens), when the conjugate point is close (in physical length) to an entrance surface of the optical element, the optical system up to an optical element adjacent on the object side to the optical element of interest is defined as the first imaging optical system or the second imaging optical system; when the conjugate point is close (in physical length) to an exit surface of the optical element, the optical system up to the optical element of interest is defined as the first imaging optical system or the second imaging optical system.

The first flat mirror M1 is located between the surface (the surface on the side of the wafer W, of the lens L53) nearest to the wafer W in the first imaging optical system G1 and the surface (the surface on the side of the first mask Ma, of the lens L1) nearest 15 to the first mask Ma in the third imaging optical system G3. The second flat mirror M2 is located between the surface (the surface on the side of the wafer W, of the lens L53) nearest to the wafer W in the second imaging optical system G2 and the surface (the surface on the side of the second mask Mb, of the lens L1) nearest to the second mask Mb in the third imaging optical system G3.

In the aforementioned embodiment the first imaging optical system G1 and the second imaging optical system G2 both are the refracting optical systems and the first imaging optical system G1 and the second imaging optical system G2 have the same configuration. However, the embodiment of the present invention is not limited to this example, but can be embodied in various forms as to the optical system type (reflection type, catadioptric type, etc.) of the first imaging optical system G1 and the second imaging optical system G2, the arrangement of refracting powers, and so on. The above-described embodiment is the application of an embodiment of the present invention to the liquid immersion type projection optical system, but, without being limited to this example, the embodiment of the present invention is also applicable similarly to dry projection optical systems without the liquid immersion region on the image side.

In the aforementioned embodiment, the ridgeline made by the reflecting surface of the first flat mirror M1 and the reflecting surface of the second flat mirror M2 is located on the point where the exit-side optical axis AX1 of the first imaging optical system G1, the exit-side optical axis AX2 of the second imaging optical system G2, and the entrance-side optical axis AX3 of the third imaging optical system G3 intersect. However, without having to be limited to this, various modifications can be contemplated for the positional relationship between the ridgeline made by the reflecting surface of the first flat mirror M1 and the reflecting surface of the second flat mirror M2, and the optical axes AX1-AX3 of the respective imaging optical systems G1-G3.

In the aforementioned embodiment, the optical axes AXa, AXb of the two illumination systems ILa, ILb are set each along the plane (YZ plane) parallel to the longitudinal direction (Y-direction) of the rectangular illumination regions IRa, IRb formed on the first mask Ma and on the second mask Mb, and the first mask Ma and the second mask Mb are spaced along the transverse direction (X-direction) of the illumination regions IRa, IRb. However, without having to be limited to this, it is also possible to adopt a modification example of the layout, as shown in FIG. 8A, wherein the rectangular illumination regions IRa, IRb having the shorter lengths along the YZ plane on which the optical axes AXa, AXb of the two illumination systems ILa, ILb are set, are formed on the respective masks Ma, Mb and wherein the masks Ma and Mb are spaced along the longitudinal direction (X-direction) of the illumination regions IRa, IRb.

Figure 8A:
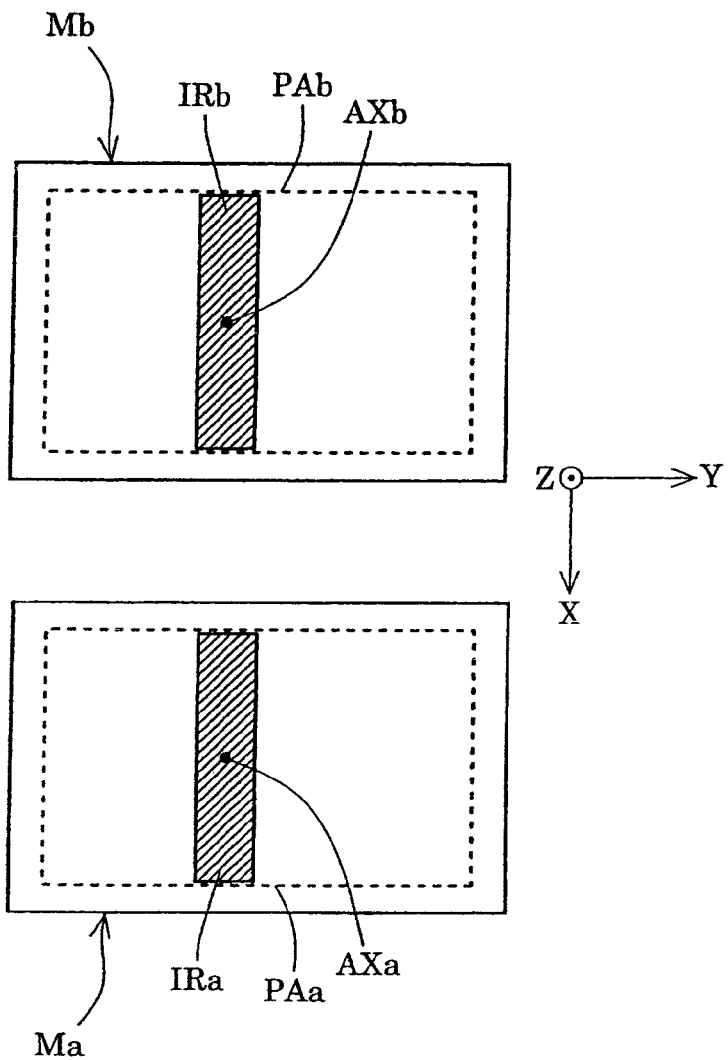
FIG. 8A is a drawing showing a pair of rectangular illumination regions in a modification example of a layout different from the embodiment.
Figure 8B:
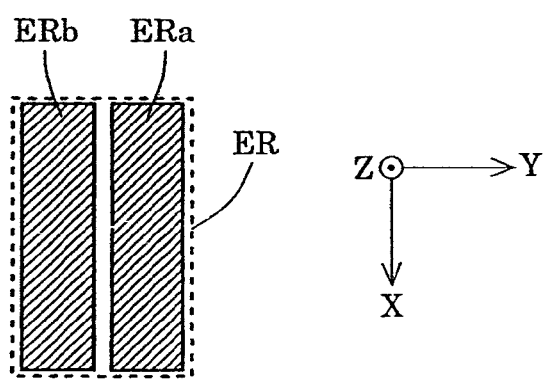
FIG. 8B is a drawing showing a pair of pattern images formed through the projection optical system in the modification example of the layout different from the embodiment.

In the modification example of the layout shown in FIG. 8A, as shown in FIG. 8B, the pattern image of the first mask Ma illuminated by the first illumination region IRa is formed in the first region ERa of the rectangular shape elongated in the X-direction in the effective imaging region ER, and the pattern image of the second mask Mb illuminated by the second illumination region IRb is formed in the second region ERb having the rectangular contour elongated similarly in the X-direction in the effective imaging region ER and located in juxtaposition in the Y-direction to the first region ERa. In this case, while the first mask Ma, the second mask Mb, and the wafer W are synchronously moved relative to the projection optical system along the Y-direction, the pattern of the first mask Ma and the pattern of the second mask Mb are doubly transferred by scanning exposure into one shot area on the wafer W to form one synthetic pattern.

In the aforementioned embodiment, the rectangular first illumination region IRa and second illumination region IRb are formed as centered on the optical axis AXa of the first illumination system ILa and on the optical axis AXb of the second illumination system ILb, respectively. However, without having to be limited to this, it is also possible to contemplate various forms as to the contour of the illumination regions IRa, IRb, the positional relationship of the illumination regions IRa, IRb to the optical axis AXa and the optical axis AXb, and so on.

In the aforementioned embodiment, the optical axis AXa of the first illumination system ILa and the optical axis AXb of the second illumination system ILb are not coaxial with the optical axis AX1 of the first imaging optical system G1 and with the optical axis AX2 of the second imaging optical system G2, respectively, but it is also possible to adopt a configuration wherein the optical axis AXa of the first illumination system ILa is coaxial with the optical axis AX1 of the first imaging optical system G1 and wherein the optical axis AXb of the second illumination system ILb is coaxial with the optical axis AX2 of the second imaging optical system G2.

In the aforementioned embodiment the aperture stop AS is disposed in the third imaging optical system G3 but, instead thereof or in addition thereto, the aperture stop AS may be disposed in the first imaging optical system G1 and in the second imaging optical system G2. The aperture stop AS can be a variable aperture stop the aperture diameter of which is variable. In this case, the aperture diameter of the variable aperture stop in the first imaging optical system G1 may be different in magnitude from the aperture diameter of the variable aperture stop in the second imaging optical system G2. An optical modulator (so called a pupil filter) for modulating a beam may be located on the pupil plane in the first imaging optical system G1 and on the pupil plane in the second imaging optical system G2 so that it can modulate a beam according to the position of the beam passing the pupil plane. Types of modulation include amplitude modulation, phase modulation, polarization modulation, and so on.

In the aforementioned embodiment, where the exposure apparatus is applied to exposure of such a pattern as a mixture of a periodic pattern and an isolated pattern in one layer on a wafer, the mask pattern can be separated into a first pattern corresponding to the periodic pattern and a second pattern corresponding to the isolated pattern, the first pattern is formed in the first mask Ma, and the second pattern in the second mask Mb. Then the double exposure can be implemented under the optimized illumination conditions by these first and second illumination systems ILa, ILb (the exposure condition with light through the first mask Ma and the exposure condition with light through the second mask Mb).

It is also possible to apply the embodiment to the following case: a periodic pattern with the pitch direction along the X-direction is provided on the first mask Ma, a periodic pattern with the pitch direction along the Y-direction is provided on the second mask Mb, and these patterns are doubly printed in one layer on a wafer. The following illumination conditions can be applied to this case: the illumination condition for illumination of the first mask Ma is dipole illumination along the pitch direction of the periodic pattern on the first mask Ma with S-polarized light for the pattern surface of the first mask Ma (or the wafer surface); the illumination condition for illumination of the second mask Mb is dipole illumination along the pitch direction of the periodic pattern on the second mask Mb with S-polarized light for the pattern surface of the second mask Mb (or the wafer surface).

It is also possible to implement progressive focus exposure under the condition that the surface of the pattern image of the first mask Ma is shifted in the direction of the optical axis (the optical axis AX3 of the third imaging optical system G3) from the surface of the pattern image of the second mask Mb. In this case, the surface of each pattern image may be parallel to or inclined from the wafer surface. The wavelength of the illumination light for illuminating the first mask Ma may be different from that of the illumination light for illuminating the second mask Mb. For example, it is also possible to implement multi-wavelength exposure, which achieves the same effect as the above-described progressive focus exposure, while the wavelength of the illumination light for illuminating the first mask Ma is made a little different from the wavelength of the illumination light for illuminating the second mask Mb.

In the cases where the exposure condition with the light passing through the first imaging optical system G1 and the third imaging optical system G3 is different from that with the light passing through the second imaging optical system G2 and the third imaging optical system G3 as described above, the imaging performance of the combined optical system of the first imaging optical system G1 and the third imaging optical system G3 may be different from that of the combined optical system of the second imaging optical system G2 and the third imaging optical system G3. For example, it is possible to adopt a configuration for controlling the imaging performance of the combined optical system of the first imaging optical system G1 and the third imaging optical system G3 and the imaging performance of the combined optical system of the second imaging optical system G2 and the third imaging optical system G3, by allowing adjustment of the position and posture of at least one optical element in the first imaging optical system G1 and adjustment of the position and posture of at least one optical element in the second imaging optical system G2. In this configuration, it is also possible to allow adjustment of the position and posture of an optical element in the third imaging optical system G3.

In the aforementioned embodiment, the first pattern and the second pattern are doubly transferred by scanning exposure in one shot area on the photosensitive substrate to form one synthetic pattern. However, without having to be limited to this, it is also possible to implement scanning exposure or one-shot exposure of the first pattern in a first shot area on the photosensitive substrate and scanning exposure or one-shot exposure of the second pattern in a second shot area on the photosensitive substrate.

In the aforementioned embodiment, the pattern image of the first illumination region of the first mask and the pattern image of the second illumination region of the second mask are formed in parallel on the photosensitive substrate. However, without having to be limited to this, it is also possible to use a projection optical system for forming the pattern image of the first illumination region of the first mask and the pattern image of the second illumination region of the second mask in alignment with each other on the photosensitive substrate, so as to implement scanning exposure or one-shot exposure of the first pattern and the second pattern in alignment in one shot area on the photosensitive substrate to form one synthetic pattern.

In the aforementioned embodiment the image of the pattern on the first mask and the image of the pattern on the second mask are formed on the photosensitive substrate. However, without having to be limited to this, it is also possible to use a projection optical system for forming the images of the first pattern and the second pattern spaced from each other on one common mask, on the photosensitive substrate, so as to implement double scanning exposure or one-shot exposure of the first pattern and the second pattern in one shot area on the photosensitive substrate to form one synthetic pattern.

The foregoing embodiment is the application of an embodiment of the present invention to the double-headed projection optical system, but, without having to be limited to this, the embodiment of the present invention can also be applied similarly to ordinary single-headed projection optical systems for forming an image of one object surface (first surface) on an image surface (second surface). Specifically, a single-headed projection optical system according to a modified example of the embodiment of the present invention comprises a first imaging optical system disposed in an optical path between an object surface and a conjugate point optically conjugate with a point on an optical axis of the object surface, a second imaging optical system disposed in an optical path between the conjugate point and an image surface, and a folding member disposed near the conjugate point and adapted to guide light from the first imaging optical system to the second imaging optical system, and every optical element having a power in the first imaging optical system and the second imaging optical system is a refractive element.

Figure 11:
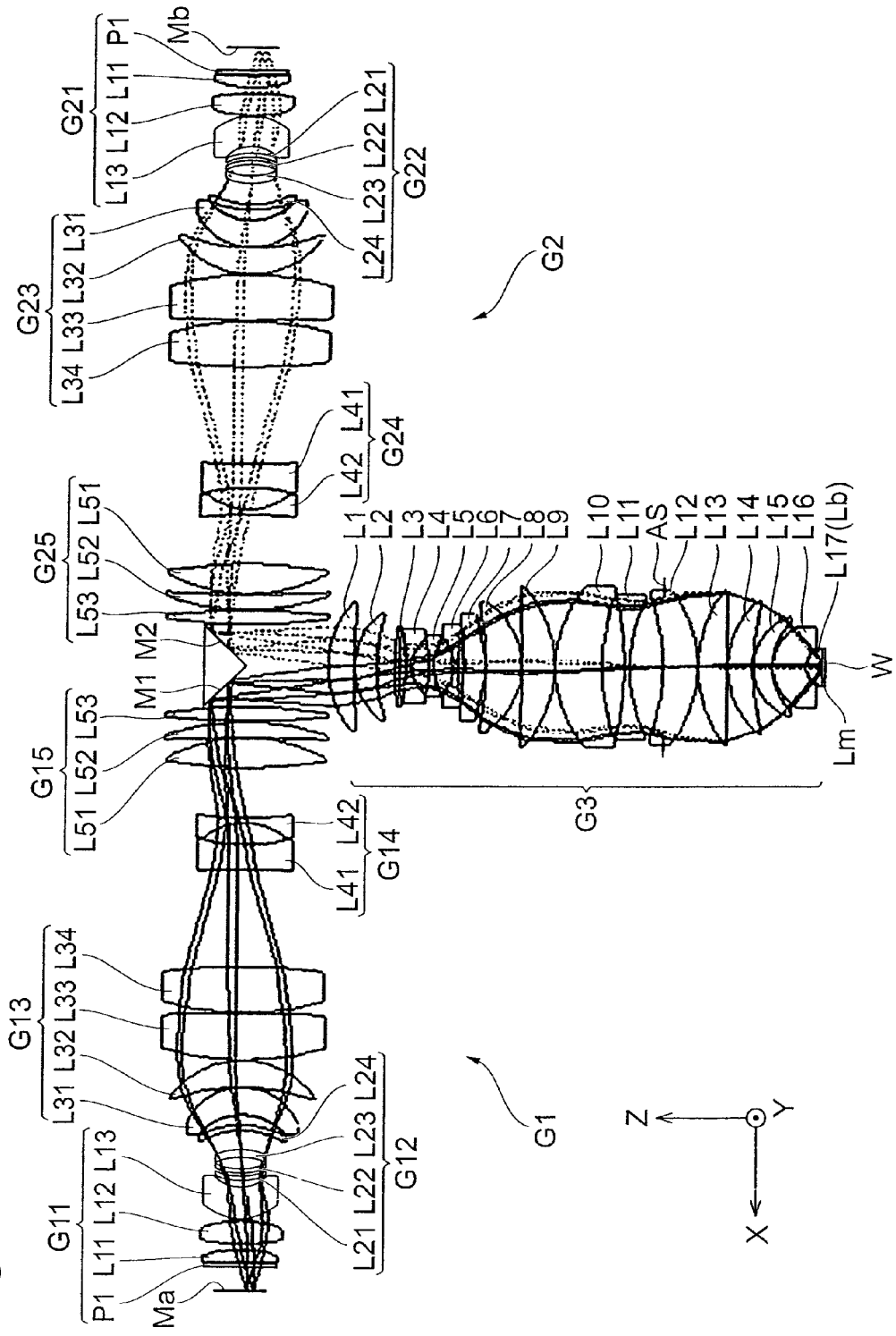
FIG. 11 is a drawing showing a lens configuration of a projection optical system according to a modified example of an example of the embodiment.

In the foregoing embodiment, the first intermediate flat mirror M1i is disposed between the third lens unit G13 and the fourth lens unit G14 in the optical path of the first imaging optical system G1 and the second intermediate flat mirror M2i is disposed between the third lens unit G23 and the fourth lens unit G24 in the optical path of the second imaging optical system G2. However, as shown in FIG. 11, the first and second intermediate flat mirrors M1i, M2i may not be disposed respectively in the optical path of the first imaging optical system G1 and in the optical path of the second imaging optical system G2. In this case, in the projection optical system PL, light traveling from the first mask Ma along the −X-direction passes through the lens units G11 to G15 in the first imaging optical system G1 to form a first intermediate image near the first flat mirror M1. Similarly, light traveling from the second mask Mb along the +X-direction passes through the lens units G21 to G25 in the second imaging optical system G2 to form a second intermediate image near the second flat mirror M2.

Figure 12:
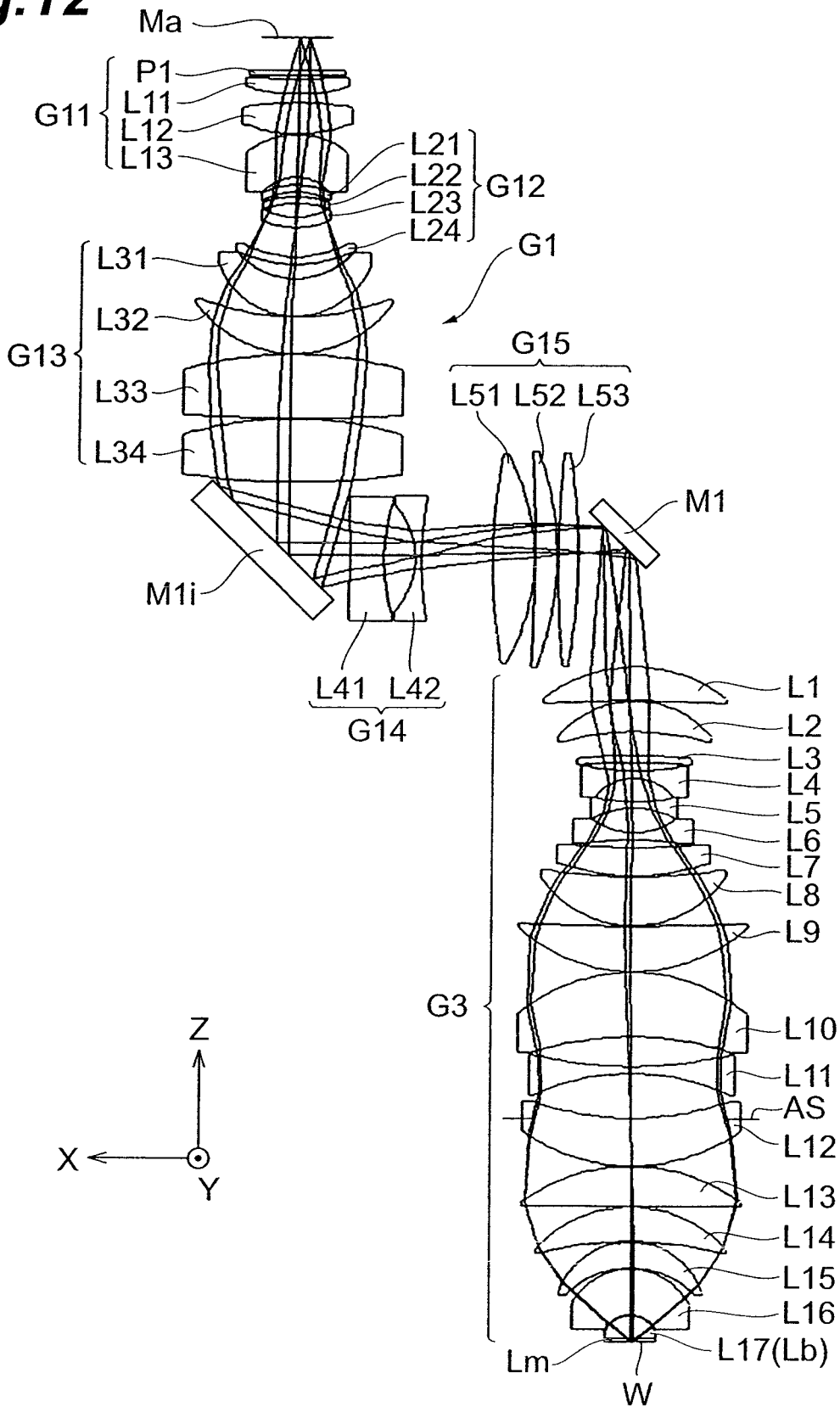
FIG. 12 is a drawing showing a lens configuration of a projection optical system according to another modified example of an example of the embodiment.

More specifically, as shown in FIG. 12, a single-headed projection optical system according to a modified example of the embodiment of the present invention is composed, for example, of the first imaging optical system G1, the first flat mirror (corresponding to the aforementioned folding member) M1, and the third imaging optical system (corresponding to the aforementioned second imaging optical system) G3 in the above-described embodiment. In this case, the following configurations can be adopted for the same reasons as those described above: the projection optical system satisfies the conditions (1) and (3); the first imaging optical system has the arrangement of positive, negative, positive, negative, and positive refracting powers; the distance on the optical axis between the intermediate folding member disposed in the optical path of the first imaging optical system, and the folding member is at least 130 mm; the optical path between the projection optical system and the image surface is filled with a liquid. In this case, the first mask Ma and the wafer surface may be arranged parallel to each other.

Figure 13:
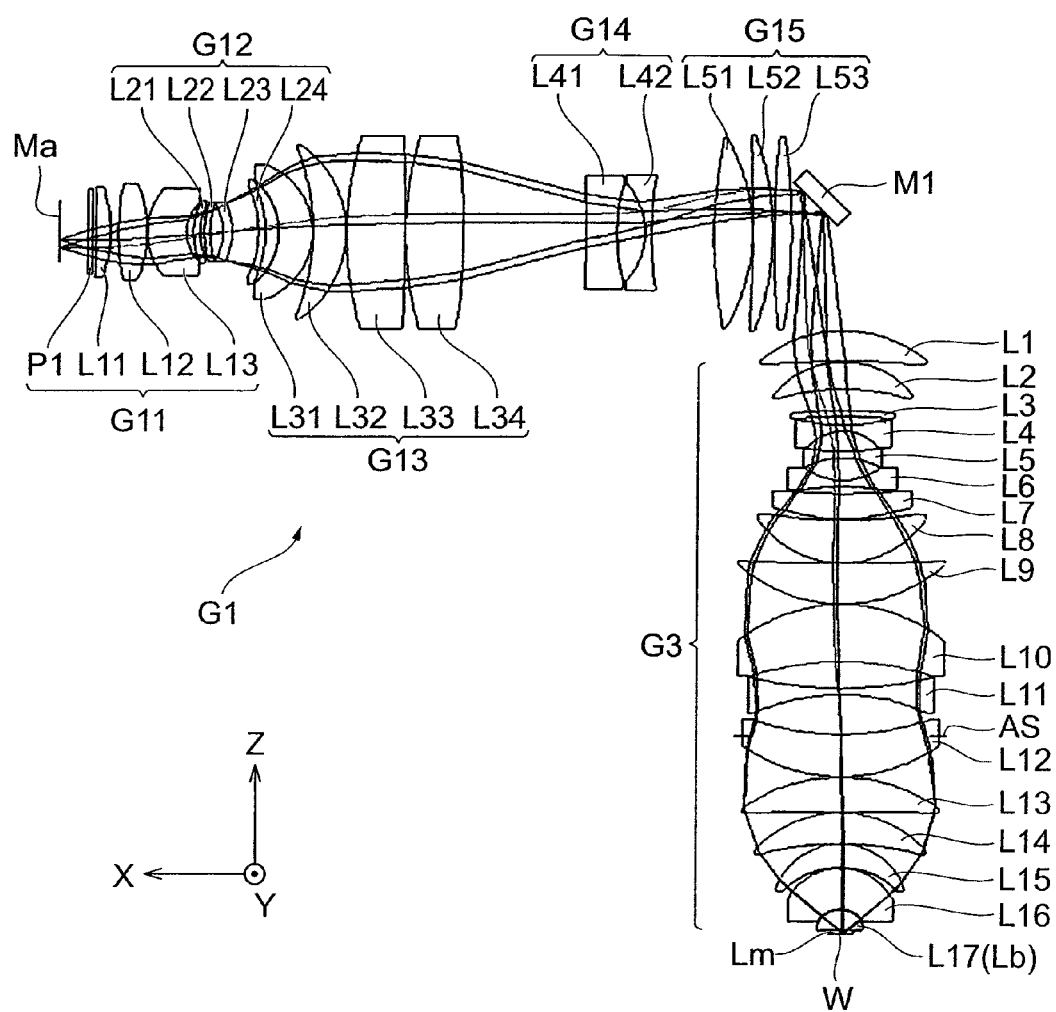
FIG. 13 is a drawing showing a lens configuration of a projection optical system according to another modified example of an example of the embodiment.

In the projection optical system shown in FIG. 12, the first intermediate flat mirror M1i is disposed between the third lens unit G13 and the fourth lens unit G14 in the optical path of the first imaging optical system G1. However, as shown in FIG. 13, the first intermediate flat mirror M1i may not be disposed in the optical path of the first imaging optical system G1. In this case, in the projection optical system PL, light traveling from the first mask Ma along the −X-direction passes through the lens units G11 to G15 in the first imaging optical system G1 to form a first intermediate image near the first flat mirror M1.

Since both of the projection optical systems shown in FIG. 12 and FIG. 13 adopt the twice-imaging double-headed basic configuration, it is able to ensure the image-side numerical aperture at a required level without increase in the size of the optical system. Since the size of the optical system can be restrained from increasing and the distance between the first surface and the second surface can be made shorter, the vibration can be suppressed in the projection optical systems shown in FIG. 12 as well as FIG. 13. The contrast of the image formed on the wafer W can be restrained from lowering in the projection optical system shown in FIG. 12 and FIG. 13 by suppression of the vibration. Furthermore, according to the projection optical systems shown in FIG. 12 as well as FIG. 13, every optical element having a power in the first imaging optical system G1 and the third imaging optical system (corresponding to the second imaging optical system described above) G3 is a refractive element. Therefore, it is possible to restrain the increase in the size of the optical system in the projection optical system shown in FIG. 12 and the projection optical system shown in FIG. 13, and it can be easy to manufacture the projection optical system shown in FIG. 12 and the projection optical system shown in FIG. 13.

The aforementioned embodiment is the application of an embodiment of the present invention to the projection optical system mounted on the exposure apparatus, but, without having to be limited to this, the embodiment of the present invention can also be applied to other appropriate double-headed or single-headed projection optical systems. In the aforementioned embodiment, the masks can be replaced with a pattern forming device for forming predetermined patterns based on predetermined electronic data. Use of this pattern forming device minimizes the effect on synchronization accuracy even when the pattern surfaces are vertical. The pattern forming device can be, for example, a spatial light modulator, such as a DMD (Digital Micromirror Device) including a plurality of reflective elements driven based on predetermined electronic data. The exposure apparatus with the DMD is disclosed, for example, in Japanese Patent Application Laid-open No. 8-313842 or Laid-open No. 2004-304135. Besides the non-emission type reflective spatial optical modulators like the DMD, it is also possible to use a transmissive spatial optical modulator or a self-emission type image display element.

The exposure apparatus according to the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus can be performed in a clean room in which the temperature, cleanliness, etc. are controlled.

The exposure apparatus according to the above-described embodiment can manufacture microdevices (semiconductor devices, imaging devices, liquid-crystal display devices, thin-film magnetic heads, etc.) through a process of illuminating a mask (reticle) by the illumination optical apparatus (illumination step) and transferring a transfer pattern formed in a mask, onto a photosensitive substrate by the projection optical system (exposure step). An example of a method for obtaining semiconductor devices as microdevices by forming a predetermined circuit pattern in a wafer or the like as a photosensitive substrate by means of the exposure apparatus of the above embodiment will be described below with reference to the flowchart of FIG. 9.

Figure 9:
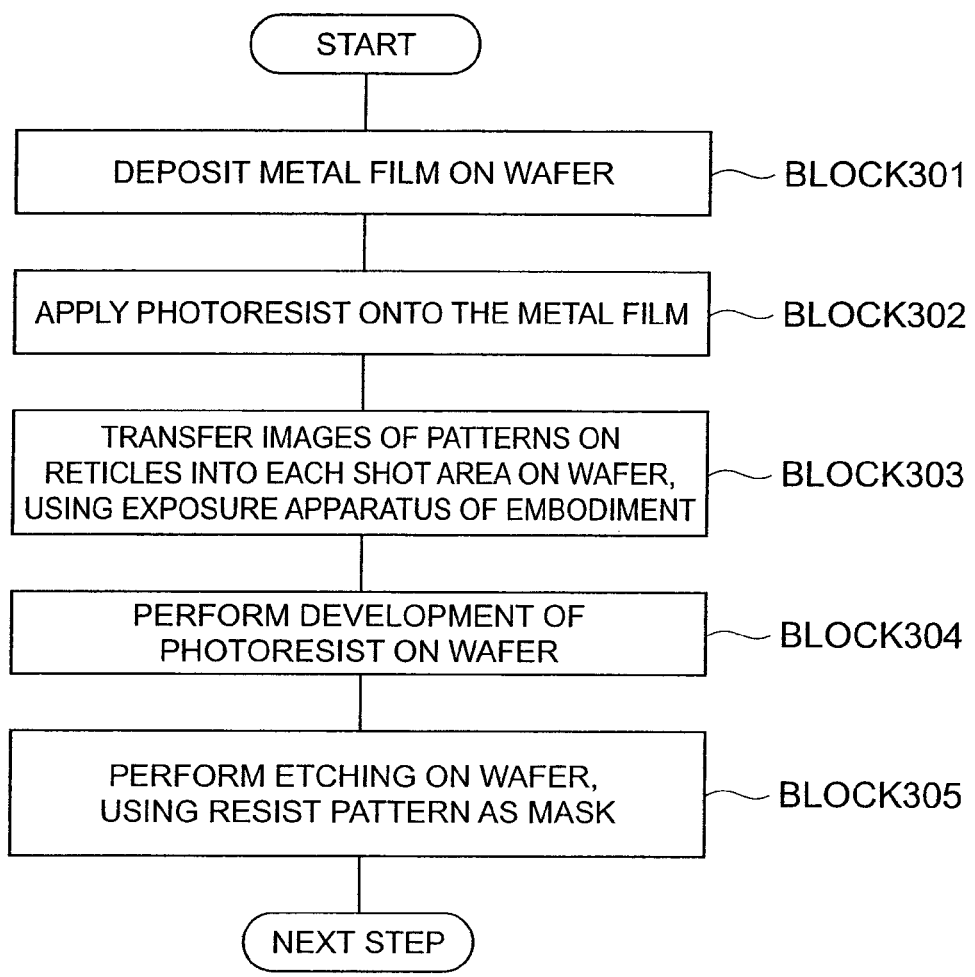
FIG. 9 is a flowchart of a method of manufacturing semiconductor devices.

The first block 301 in FIG. 9 is to deposit a metal film on each wafer in one lot. The next block 302 is to apply a photoresist onto the metal film on each wafer in the lot. The subsequent block 303 is to use the exposure apparatus of the above embodiment to sequentially transfer an image of a pattern on a mask into each shot area on each wafer in the lot through the projection optical system of the exposure apparatus. The subsequent block 304 is to perform development of the photoresist on each wafer in the lot and the next block 305 is to perform etching using the resist pattern on each wafer in the lot as a mask, and thereby to form a circuit pattern corresponding to the pattern on the mask, in each shot area on each wafer.

Thereafter, devices such as semiconductor devices are manufactured through formation of circuit patterns in upper layers and so on. The above-described semiconductor device manufacturing method permits us to obtain the semiconductor devices with extremely fine circuit patterns at high throughput. The blocks 301-305 are arranged to perform the respective blocks for deposition of metal on the wafer, application of the resist onto the metal film, exposure, development, and etching, but it is needless to mention that the process may be modified as follows: prior to these blocks, an oxide film of silicon is formed on the wafer, a resist is then applied onto the silicon oxide film, and thereafter the blocks for exposure, development, and etching are carried out.

Figure 10:
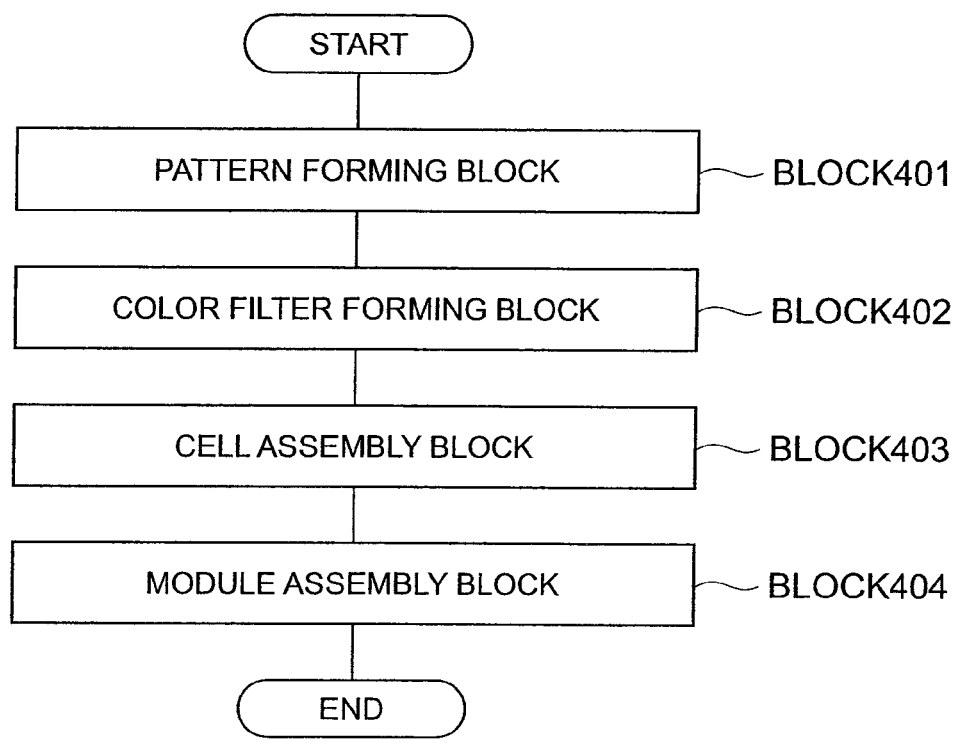
FIG. 10 is a flowchart of a method of manufacturing a liquid-crystal display device.

The exposure apparatus of the above embodiment can also manufacture a liquid-crystal display device as a microdevice by forming predetermined patterns (circuit pattern, electrode pattern, etc.) on plates (glass substrates). An example of a method in this case will be described below with reference to the flowchart of FIG. 10. In FIG. 10, a pattern forming block 401 is to execute the so-called photolithography block for transferring a pattern of a mask onto a photosensitive substrate (a glass substrate coated with a resist or the like) by means of the exposure apparatus of the above embodiment. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), G (Green), and B (Blue) are arrayed in a matrix pattern or in which sets of filters of three stripes of R, G, and B are arrayed in the horizontal scan line direction. After the color filter forming block 402, a cell assembling block 403 is executed. The cell assembling block 403 is to assemble a liquid crystal panel (liquid crystal cell), using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and a backlight for display operation of the assembled liquid crystal panel (liquid crystal cell), to complete the liquid-crystal display device. The above-described manufacturing method of the liquid-crystal display device permits us to obtain the liquid-crystal display device with extremely fine circuit patterns at high throughput.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. A projection optical system for forming an image of a first surface and an image of a second surface on a third surface, comprising:
    a first imaging optical system disposed in an optical path between the first surface and a first conjugate point optically conjugate with a point on an optical axis of the first surface;
    a second imaging optical system disposed in an optical path between the second surface and a second conjugate point optically conjugate with a point on an optical axis of the second surface;
    a third imaging optical system disposed in an optical path between the third surface and, the first conjugate point and the second conjugate point;
    a first folding member which is disposed between the surface nearest to the third surface in the first imaging optical system and the surface nearest to the first surface in the third imaging optical system and which guides light from the first imaging optical system to the third imaging optical system; and
    a second folding member which is disposed between the surface nearest to the third surface in the second imaging optical system and the surface nearest to the second surface in the third imaging optical system and which guides light from the second imaging optical system to the third imaging optical system;
    wherein every optical element including a power in the third imaging optical system is a refractive element,
    wherein the first conjugate point is located between a surface nearest to the third surface in the first imaging optical system and a surface nearest to the first surface in the third imaging optical system,
    wherein the second conjugate point is located between a surface nearest to the third surface in the second imaging optical system and a surface nearest to the second surface in the third imaging optical system, and
    a ridgeline made by intersection of a reflecting surface of the first folding member with a reflecting surface of the second folding member is located on a point where the optical axes of the first, second, and third imaging optical systems intersect.

2. A projection optical system according to claim 1, wherein the first folding member is disposed near the first conjugate point, and wherein the second folding member is disposed near the second conjugate point.

3. A projection optical system according to claim 1, which includes a reducing rate.

4. A projection optical system according to claim 1, wherein every optical element including a power in the first imaging optical system and the second imaging optical system is a refractive element.

5. A projection optical system according to claim 1, wherein the first imaging optical system and the second imaging optical system include the same configuration.

6. A projection optical system according to claim 1, which satisfies the following conditions:

$5.5 < |\beta 1/\beta|;$ $5.5 < |\beta 2/\beta|,$ where β1 is an imaging magnification of the first imaging optical system, β2 an imaging magnification of the second imaging optical system, and β a projection magnification of the projection optical system.

7. A projection optical system according to claim 1, which satisfies the following conditions:

$$5<|\beta 1/\beta|<15;$$

$$5<|\beta 2/\beta|<15,$$

where β1 is an imaging magnification of the first imaging optical system, β2 an imaging magnification of the second imaging optical system, and β a projection magnification of the projection optical system.

8. A projection optical system according to claim 1, which satisfies the following conditions:

$$5.5<|\beta 1/\beta|<15;$$

$$5.5<|\beta 2/\beta|<15,$$

where β1 is an imaging magnification of the first imaging optical system, β2 an imaging magnification of the second imaging optical system, and β a projection magnification of the projection optical system.

9. A projection optical system according to claim 1, wherein each of the first imaging optical system and the second imaging optical system is comprised of a first lens unit including a positive refracting power, a second lens unit including a negative refracting power, a third lens unit including a positive refracting power, a fourth lens unit including a negative refracting power, and a fifth lens unit including a positive refracting power, in the order named from the entrance side of light.

10. A projection optical system according to claim 1, further comprising a first intermediate folding member disposed in an optical path of the first imaging optical system, and a second intermediate folding member disposed in an optical path of the second imaging optical system,
wherein each of a distance on the optical axis between the first folding member and the first intermediate folding member and a distance on the optical axis between the second folding member and the second intermediate folding member is at least 130 mm.

11. A projection optical system according to claim 1, which includes a first effective field region not including the optical axis on the first surface, and a second effective field region not including the optical axis on the second surface, and which satisfies the following conditions:

$$0.03<LO1/B<0.4;$$

$$0.03<LO2/B<0.4,$$

where LO1 is a spacing between the optical axis and a first effective imaging region formed corresponding to the first effective field region, on the third surface, LO2 a spacing between the optical axis and a second effective imaging region formed corresponding to the second effective field region, on the third surface, and B a maximum image height on the third surface.

12. A projection optical system according to claim 1, which includes a first effective field region not including the optical axis on the first surface, and a second effective field region not including the optical axis on the second surface, and which satisfies the following conditions:

$$0.05<LO1/B<0.4;$$

$$0.05<LO2/B<0.4,$$

where LO1 is a spacing between the optical axis and a first effective imaging region formed corresponding to the first effective field region, on the third surface, LO2 a spacing between the optical axis and a second effective imaging region formed corresponding to the second effective field region, on the third surface, and B a maximum image height on the third surface.

13. A projection optical system according to claim 1, which includes a first effective field region not including the optical axis on the first surface, and a second effective field region not including the optical axis on the second surface, and which satisfies the following conditions:

$$0.03<LO1/B<0.3;$$

$$0.03<LO2/B<0.3,$$

where LO1 is a spacing between the optical axis and a first effective imaging region formed corresponding to the first effective field region, on the third surface, LO2 a spacing between the optical axis and a second effective imaging region formed corresponding to the second effective field region, on the third surface, and B a maximum image height on the third surface.

14. A projection optical system according to claim 1, which includes a first effective field region not including the optical axis on the first surface, and a second effective field region not including the optical axis on the second surface, and which satisfies the following conditions:

$$0.05<LO1/B<0.3;$$

$$0.05<LO2/B<0.3,$$

where LO1 is a spacing between the optical axis and a first effective imaging region formed corresponding to the first effective field region, on the third surface, LO2 a spacing between the optical axis and a second effective imaging region formed corresponding to the second effective field region, on the third surface, and B a maximum image height on the third surface.

15. A projection optical system according to claim 1, which is used in a state in which an optical path between the projection optical system and the third surface is filled with a liquid.

16. A projection optical system according to claim 1, wherein the first surface and the second surface are set on a same surface.

17. An exposure apparatus comprising the projection optical system as set forth in claim 1, for, based on light from a predetermined pattern set on the first surface, projecting an image of the pattern onto a photosensitive substrate set on the third surface.

18. A device manufacturing method comprising:
exposing the photosensitive substrate to the light from the predetermined pattern, using the exposure apparatus as set forth in claim 17;
developing the photosensitive substrate on which the pattern was transferred, to form a mask layer of a shape corresponding to the pattern, on a surface of the photosensitive substrate; and
processing the surface of the photosensitive substrate through the mask layer.

19. A projection optical system according claim 1, which satisfies the following conditions:

$$5<|\beta 1/\beta|, \text{ and}$$

$$5<|\beta 2/\beta|,$$

where β1 is an imaging magnification of the first imaging optical system, β2 is an imaging magnification of the second imaging optical system, and $\beta$ is a projection magnification of the projection optical system.

20. A projection optical system according claim 1, which satisfies the following condition:

$$5<|\beta 1/\beta|,$$

where $\beta 1$ is an imaging magnification of the first imaging optical system, and $\beta$ is a projection magnification of the projection optical system.

* * * * *

UNITED STATES PATENT AND TRADEMARK OFFICE
CERTIFICATE OF CORRECTION

| | | |
|---|---|---|
| PATENT NO. | : 8,665,418 B2 | Page 1 of 1 |
| APPLICATION NO. | : 12/050903 | |
| DATED | : March 4, 2014 | |
| INVENTOR(S) | : Yashuhiro Omura | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 939 days.

Signed and Sealed this
Twentieth Day of October, 2015

Michelle K. Lee
*Director of the United States Patent and Trademark Office*